United States Patent
Shiba et al.

(10) Patent No.: US 12,266,540 B2
(45) Date of Patent: *Apr. 1, 2025

(54) METHOD FOR FABRICATING LAYER STRUCTURE HAVING TARGET TOPOLOGICAL PROFILE

(71) Applicant: ASM IP Holding B.V., Almere (NL)

(72) Inventors: Eiichiro Shiba, Hachioji (JP); Yoshinori Ota, Tama (JP); René Henricus Jozef Vervuurt, Tama (JP); Nobuyoshi Kobayashi, Kawagoe (JP); Akiko Kobayashi, Inagi (JP)

(73) Assignee: ASM IP Holding B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 18/530,759

(22) Filed: Dec. 6, 2023

(65) Prior Publication Data
US 2024/0128090 A1    Apr. 18, 2024

Related U.S. Application Data

(63) Continuation of application No. 17/192,865, filed on Mar. 4, 2021, now Pat. No. 11,961,741.

(60) Provisional application No. 62/988,907, filed on Mar. 12, 2020.

(51) Int. Cl.
*H01L 21/311*    (2006.01)
*H01L 21/02*    (2006.01)

(52) U.S. Cl.
CPC .. *H01L 21/31116* (2013.01); *H01L 21/02164* (2013.01); *H01L 21/0217* (2013.01)

(58) Field of Classification Search
CPC ......... H01L 21/31116; H01L 21/02164; H01L 21/0217
See application file for complete search history.

(56) References Cited

U.S. PATENT DOCUMENTS

| | | | |
|---|---|---|---|
| 6,432,785 B1 | 8/2002 | Wu | |
| 10,354,888 B2 | 7/2019 | Tan et al. | |
| 10,720,337 B2 | 7/2020 | Vervuurt et al. | |
| 11,961,741 B2* | 4/2024 | Shiba | H01L 21/0228 |
| 2019/0043876 A1* | 2/2019 | van Schravendijk | G11C 16/0466 |
| 2020/0194447 A1* | 6/2020 | Sun | H10B 41/41 |

* cited by examiner

*Primary Examiner* — Monica D Harrison
*Assistant Examiner* — Andre C Stevenson
(74) *Attorney, Agent, or Firm* — Snell & Wilmer L.L.P.

(57) ABSTRACT

A method for fabricating a layer structure having a target topology profile in a step which has a side face and a lateral face, includes processes of: (a) depositing a dielectric layer on a preselected area of the substrate under first deposition conditions, wherein the dielectric layer has a portion whose resistance to fluorine and/or chlorine radicals under first dry-etching conditions is tuned; and (b) exposing the dielectric layer obtained in process (a) to the fluorine and/or chlorine radicals under the first dry-etching conditions, thereby removing at least a part of the portion of the dielectric layer, thereby forming a layer structure having the target topology profile on the substrate.

16 Claims, 25 Drawing Sheets
(2 of 25 Drawing Sheet(s) Filed in Color)

Fig. 18A

| TpSiN | Top Remaining | | Side Remaining | |
|---|---|---|---|---|
| AsDepo @400C | A | B | | C |
| Film Thickness [nm] | Top | 9.2 | 9.8 | 10.8 |
| | Side | 8.2 | 6.6 | 6.5 |
| After Dry Etch Remote NF3 7sec. @400C | D | E | | F |
| Film Thickness [nm] | Top | 5.7 | 2.5 | 2.5 |
| | Side | 2.5 | 3.3 | 3.3 |
| Etching Rate selectivity | 1.6 (Side/Top) | 2.3 (Top/Side) | | 2.6 (Top/Side) |

Fig. 18B

| Condition | | A | B,C | D,E,F |
|---|---|---|---|---|
| Process | | Deposition | Deposition | Etching |
| | | Top Remaining | Side Remaining | NF3 Remote plasma |
| Precursor | | SiH2I2 | SiH2I2 | |
| NF3 | [slm] | - | - | 0.25 |
| CLN Ar | [slm] | - | - | 10.0 |
| P-N2 | [slm] | 10.0 | 10.0 | - |
| Ar | [slm] | - | - | 5.0 |
| Carrier gas1 | [slm] | 2.0 (N2) | 2.0 (N2) | 4.0 (Ar) |
| Carrier gas2 | [slm] | 2.0 (N2) | 2.0 (N2) | 4.0 (Ar) |
| Seal N2 | [slm] | 0.20 | 0.20 | 0.43 |
| RC Press | [Pa] | 350 | 350 | 1000 |
| HRF Power | [W] | 95 | 940 | - |
| Precursor BTL Temp | [deg C] | 35 | 35 | 35 |
| IGS Temp | [deg C] | 75 | 75 | 75 |
| SUS temp | [deg C] | 400 | 400 | 400 |
| SHD temp | [deg C] | 200 | 200 | 200 |
| Wall Temp | [deg C] | 150 | 150 | 150 |
| Gap | [mm] | 15 | 15 | 15 |
| STEP Time [sec.] | Source-Feed | 0.45 | 0.30 | |
| | Source-Purge | 0.50 | 0.50 | |
| | RF-ON | 3.30 | 3.30 | |
| | Post-Purge | 0.10 | 0.10 | |
| | Total time | 4.35 | 4.35 | - |
| Process Time | Cycles / sec. | 405 cycles | 252 cycles | 7 sec. |

METHOD FOR FABRICATING LAYER STRUCTURE HAVING TARGET TOPOLOGICAL PROFILE

CROSS-REFERENCE TO RELATED APPLICATIONS

This application is a continuation of, and claims priority to, U.S. patent application Ser. No. 17/192,865 filed Mar. 4, 2021 titled METHOD FOR FABRICATING LAYER STRUCTURE HAVING TARGET TOPOLOGICAL PROFILE, which claims the benefit of U.S. Provisional Patent Application No. 62/988,907, filed on Mar. 12, 2020, in the United States Patent and Trademark Office, the disclosures of which are incorporated herein in their entirety by reference.

BACKGROUND

Field of the Invention

The present invention relates generally to a method for fabricating a layer structure constituted by a dielectric layer in a step formed on a substrate.

Related Art

For etching of films such as those constituted by metal-oxides, nitrides, or carbides, plasma etching is often used because etch rates are typically high (10-100 nm/s), and the etching is typically anisotropic due to the presence of ions. The presence of ions results in a relatively poor etch-selectivity between materials. On the other hand, wet etching is typically isotropic and often enables etch selectivity to increase but reduces wafer-to-wafer reproducibility and/or uniformity, as well as throughput. Also, wet etching produces a large amount of chemical waste and thus is often associated with safety and environmental concerns, raising an issue.

To achieve uniform etching with enough etch selectivity, radicals-based etching may effectively be used. This can bring about combined benefits of dry etching with good selectivity and wet etching with isotropic property. For their actual applications, however, a specific patterning scheme and a specific etch selectivity will need to be further investigated when using different materials for adjacent layers to produce a desired structure with a specific topology profile. Although radical etch technology is known in the art such as those disclosed in U.S. Pat. Nos. 9,064,815 and 9,275,834, further improvement will be required particularly for forming a film with a desired topology profile.

In particular, selective-etching of SiN films using wet-etch chemicals has been widely used in manufacturing semiconductor devices. For example, SiN films are selectively etched by hot (>100° C.) phosphoric acid solution with water in a structure of $SiN/SiO_2$ stacking layers for, e.g., making memory cells of 3D-NAND devices. However, the etch rate varies depending on several parameters such as chemical concentration, temperature, and duration of dipping. Further, precise control over the etch rate on the nanometer order is difficult and the process throughput is relatively low since a drying process is required after a wet-cleaning process. Moreover, the wet-etch chemical waste is sometimes harmful to our health, requiring special solid wet-cleaning baths for safety and environmental concerns.

On the other hand, dry etching using either a $SF_6$ or $NF_3$ plasma is known and typically used for a side-remaining topology profile of SiN film coating. Due to the presence of ions, dry etching is typically directional, which increases the etch rate of surfaces exposed to ions (typically horizontal surfaces). The presence of ions often makes it difficult to achieve conformal etching or top-remaining etching. For this reason, wet etching is typically used more often in some cases than is dry etching. See US 20170345674A1 (Dry Etching with $NF_3/O_2$), US 20180204733A1 (Dry Etching with $SF_6$), and US 20120289056A1 (Wet Etching with Phosphoric Acid).

Wet etching can typically be performed in a manner disclosed in U.S. Pat. No. 9,754,779B1 wherein a SiN film is deposited on a patterned surface under controlled conditions, followed by subjecting it to wet etching using dHF solution, thereby providing either a sidewall-remaining topology profile or top/bottom-remaining topology profile in the SiN film. This technology utilizes the wet-etching characteristics of the SiN film against chemicals, wherein chemical resistance of the SiN film differs between its horizontal surface portion and its vertical surface portion. However, in order to leave a portion of the SiN film on sidewalls of the patterned structure or a portion of the SiN film on top/bottom of surfaces of the patterned structure in the disclosed methods, the deposition process and the wet-etching process, which are by nature different processes, must be performed in different treatment chambers, respectively, resulting in high cost, low throughput, large footprint, and other concerns.

It should be noted that as discussed above, any discussion of problems and solutions in relation to the related art has been included in this disclosure solely for the purposes of providing a context for the present invention, and should not be taken as an admission that any or all of the discussion was known at the time the invention was made or this application is filed.

SUMMARY

In view of the foregoing, some embodiments provide a method for fabricating a layer structure having a target topology profile in a step which has a side face and a lateral face, comprising processes of: (a) depositing a dielectric layer on a preselected area of the substrate under first deposition conditions, wherein the dielectric layer has a portion whose resistance to fluorine and/or chlorine radicals under first dry-etching conditions is tuned; and (b) exposing the dielectric layer obtained in process (a) to the fluorine and/or chlorine radicals under the first dry-etching conditions, thereby removing at least a part of the portion of the dielectric layer, thereby forming a layer structure having the target topology profile on the substrate. The target topology profile may typically be a side face-remaining topology profile, a lateral face-remaining topology profile, or a conformal topology profile.

In some embodiments, the method further comprises processes of, prior to process (a): (i) providing reference deposition conditions and reference dry-etching conditions under which a layer structure having a reference topology profile is formed in the step on the substrate by conducting process (a) and process (b); (ii) upon comparing the thus-obtained reference topology profile with the target topology profile, changing at least one parameter of the reference deposition conditions and/or at least one parameter of the reference dry-etching conditions in a manner forming a layer structure having a topology profile in the step on the substrate, which is more similar to the target topology profile than is the reference topology profile; (iii) conducting process (a) and process (b) under the changed deposition/dry-etching conditions; and optionally (iv) repeating processes (ii) and (iii) until the thus-obtained topology profile is substantially equivalent to the target topology profile. Conducting processes (i) to (iv) is preferable and allows efficiently determining the first deposition conditions and the first dry-etching conditions for suitably tuning chemical resistance of the second dielectric layer with reference to that of the first dielectric layer. However, conducting processes (i) and (iv) is not specifically essential to conducting processes (a) and (b), since the principal of "etch selectivity" is known in the art (e.g., etch selectivity of films in wet etching), and a skilled artisan in the art can determine conditions and/structures necessary for conducting processes (a) and (b) in view of the present disclosure, especially with the guidance disclosed herein, as a matter of routine experimentation, without undue burden.

Among various embodiments, a first exemplary embodiment involves a method wherein the dielectric layer is constituted by a first dielectric layer deposited on the substrate and a second dielectric layer deposited on and in contact with the first dielectric layer, wherein the second dielectric layer has a turned resistance to fluorine and/or chlorine radicals in a manner that an etch selectivity of the second dielectric layer over the first dielectric layer is at least 5 (e.g., at least 10, 50, 100, 500, or 1,000) wherein the etch selectivity is defined as a ratio of etch rate of the second dielectric layer to etch rate of the first dielectric layer under the first dry-etching conditions.

In some embodiments of the method, the first dielectric layer is constituted by an oxide film, and the second dielectric layer is constituted by silicon nitride film. In some embodiments of the method, the first dielectric layer and the second dielectric layer are of a same type wherein primary chemical bonds constituting the first and second dielectric layers are the same.

A second exemplary embodiment involves a method wherein a first portion of the dielectric layer deposited on the side face and a second portion of the dielectric layer deposited on the lateral face have different resistances to fluorine and/or chlorine radicals under the first dry-etching conditions in a manner that an etch selectivity of one of the first and second portions, whichever has a lower etch rate than that of another of the first and second portions under the first dry-etching conditions, is at least 1.5 (e.g., at least 1.7, 2.0, 2.5, or 3.0), wherein the etch selectivity of the one of the first and second portions is defined as a ratio of etch rate of the one of the first and second portions to etch rate of another of the first and second portions under the first dry-etching conditions. In the first exemplary embodiment, the dielectric layer is constituted by the first and second dielectric layers which are laminated and have different dry etch selectivity, whereas in the second exemplary embodiment, the dielectric layer is constituted by the first portion (side portion) and the second portion (lateral portion) which have different dry etch selectivity. However, these embodiments can be practiced in any combination.

A third exemplary embodiment involves a method wherein a portion of the dielectric layer deposited on the side face and a portion of the dielectric layer deposited on the lateral face have different thicknesses. Although the first and second exemplary embodiments utilize the difference in etch selectivity to achieve the target topology profile of the final layer structure, the third exemplary embodiment can achieve the target topology profile of the final layer structure without requiring the difference in etch selectivity. However, the third exemplary embodiment can be practiced in any combination with the first and/or second exemplary embodiment(s).

A fourth exemplary embodiment involves a method wherein process (a) and process (b) are conducted in a same chamber. In some embodiments of the method, the fluorine and/or chlorine radicals are fluorine radicals generated remotely or within the same chamber, from a gas containing fluorine and nitrogen and a noble gas. This exemplary embodiment can be conducted in combination with any one or more of the disclosed embodiments.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

The patent or application file contains at least one drawing executed in color. Copies of this patent or patent application publication with color drawing(s) will be provided by the Office upon request and payment of necessary fee.

FIG. 18A shows, by way of example, Scanning Transmission Electron Microscope (STEM) photographs of cross-sectional views of silicon nitride films formed before dry etching ("AsDepo") and after dry etching ("After Dry Etch").

FIG. 18B is a table showing the deposition conditions and dry-etching conditions for forming the layer structures shown in FIG. 18A.

DETAILED DESCRIPTION OF EMBODIMENTS

Figure 1:
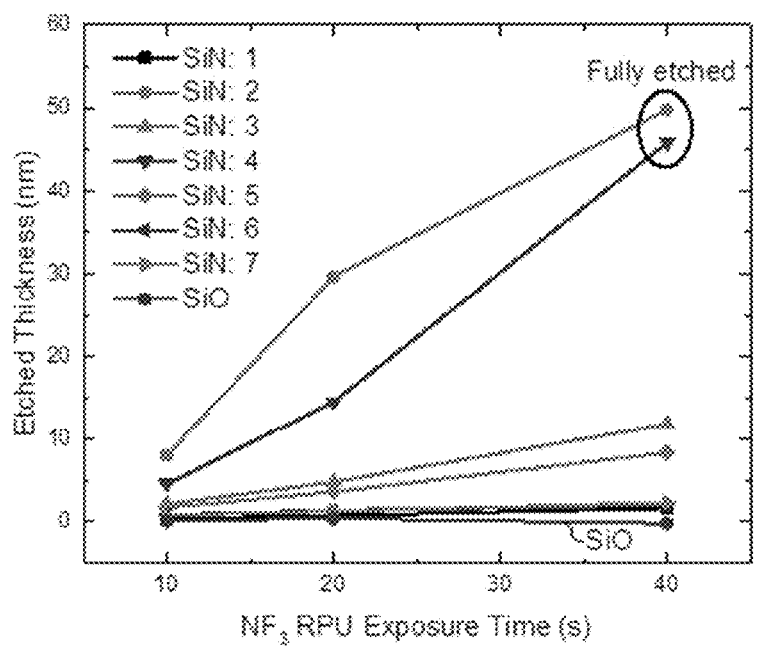
FIG. 1 is a graph showing, by way of example, etched thickness of different SiN films in relation to $NF_3$ remote plasma exposure time.

In this disclosure, a SiN is a film characterized or recognized as a silicon nitride film which may include other elements such as oxygen, carbon, hydrogen, etc. and unavoidable impurities to the extent that such elements do not materially change the characteristics of the silicon nitride film, wherein a SiN film includes not only SiN films, but also SiNC films, SiNO films, SiNCO films, or the like, depending on the process recipe, wherein these film names are commonly accepted abbreviations in the art, indicating merely the film types (indicating simply by primary constituent elements), in a non-stoichiometric manner unless described otherwise. In some embodiments, a SiN has a dielectric constant of about 2 to 10, typically about 4 to 8. Similarly, a SiO film is a film characterized or recognized as a silicon oxide film which may include other elements such as nitrogen, carbon, hydrogen, etc. and unavoidable impurities to the extent that such elements do not materially change the characteristics of the silicon oxide film, wherein a SiO film includes not only SiO films, but also SiOC films, SiON films, SiOCN films, or the like.

In this disclosure, a "step" refers to any structure having a top surface, a sidewall, and a bottom surface formed on a substrate, which may continuously be arranged in series in a height direction or may be a single step, and which may constitute a trench, a via hole, or other recesses.

In some embodiments, the trench has a width of 10 to 50 nm (typically 15 to 30 nm) (wherein when the trench has a length substantially the same as the width, it is referred to as a hole/via, and a diameter thereof is 10 to 50 nm), a depth of 30 to 200 nm (typically 50 to 150 nm), and an aspect ratio of 3 to 20 (typically 3 to 10).

In this disclosure, "gas" may include vaporized solid and/or liquid and may be constituted by a single gas or a mixture of gases. In this disclosure, a process gas introduced to a reaction chamber through a showerhead may be comprised of, consist essentially of, or consist of a precursor gas and an additive gas. The precursor gas and the additive gas are typically introduced as a mixed gas or separately to a reaction space. The precursor gas can be introduced with a carrier gas such as a noble gas. The additive gas may be comprised of, consist essentially of, or consist of a reactant gas and a dilution gas such as a noble gas. The reactant gas and the dilution gas may be introduced as a mixed gas or separately to the reaction space. A precursor may be comprised of two or more precursors, and a reactant gas may be comprised of two or more reactant gases. The precursor is a gas chemisorbed on a substrate and typically containing a metalloid or metal element which constitutes a main structure of a matrix of a dielectric film, and the reactant gas for deposition is a gas reacting with the precursor chemisorbed on a substrate when the gas is excited to fix an atomic layer or monolayer on the substrate. "Chemisorption" refers to chemical saturation adsorption. A gas other than the process gas, i.e., a gas introduced without passing through the showerhead, may be used for, e.g., sealing the reaction space, which includes a seal gas such as a noble gas. In some embodiments, "film" refers to a layer continuously extending in a direction perpendicular to a thickness direction substantially without pinholes to cover an entire target or concerned surface, or simply a layer covering a target or concerned surface. In some embodiments, "layer" refers to a structure having a certain thickness formed on a surface or a synonym of film or a non-film structure. A film or layer may be constituted by a discrete single film or layer having certain characteristics or multiple films or layers, and a boundary between adjacent films or layers may or may not be clear and may be established based on physical, chemical, and/or any other characteristics, formation processes or sequence, and/or functions or purposes of the adjacent films or layers.

In this disclosure, "annealing" refers to a process during which a material is treated to get into its stable form, e.g., a terminal group (such as an alcohol group and hydroxyl group) present in a component is replaced with a more stable group (such as a Si-Me group) and/or forms a more stable form (such as a Si—O bond), typically causing densification of a film.

Further, in this disclosure, the article "a" or "an" refers to a species or a genus including multiple species unless specified otherwise. The terms "constituted by" and "having" refer independently to "typically or broadly comprising", "comprising", "consisting essentially of", or "consisting of" in some embodiments. Also, in this disclosure, any defined meanings do not necessarily exclude ordinary and customary meanings in some embodiments.

Additionally, in this disclosure, any two numbers of a variable can constitute a workable range of the variable as the workable range can be determined based on routine work, and any ranges indicated may include or exclude the endpoints. Additionally, any values of variables indicated (regardless of whether they are indicated with "about" or not) may refer to precise values or approximate values and include equivalents, and may refer to average, median, representative, majority, etc. in some embodiments.

In the present disclosure where conditions and/or structures are not specified, the skilled artisan in the art can readily provide such conditions and/or structures, in view of the present disclosure, as a matter of routine experimentation. In all of the disclosed embodiments, any element used in an embodiment can be replaced with any elements equivalent thereto, including those explicitly, necessarily, or inherently disclosed herein, for the intended purposes. Further, the present invention can equally be applied to apparatuses and methods.

The embodiments will be explained with respect to preferred embodiments. However, the present invention is not limited to the preferred embodiments.

Some embodiments involve dry-etching of different metal-containing materials for performing conformal etching, or for creating top- or side-remaining structures, by using fluorine radicals. A difference in etch selectivity between different metal compounds manifests and varies depending on the substrate temperature and the volatility of their resultant reaction products. Etch selectivity can therefore be tuned by the substrate temperature and appropriate choice of the reaction chemistry. In this disclosure, the term "metal" may include a metalloid element such as silicon depending on the context. Also, in this disclosure, the term "material" in the above context refers to elements, constituents, or substance of which a film is composed, wherein different materials may include materials which are elementally different, materials which are elementally the same but compositionally different, and materials which are elementally and compositionally the same but have different physical and/or chemical properties.

Top- and/or side-remaining structures can be created by (1) changing the deposition conditions of the material next subjected to dry etching. In some embodiments, the etch rates which can be achieved are in a range of 0.1-1 nm/s, allowing good control for the etching while maintaining good throughput. (2) Changing the dry etch conditions may also be conducted in combination with (1) or as an alternative to (1). The proposed dry-etching process flow can also make it possible to perform both deposition and etching in a same chamber or in a same cluster tool (with multiple chambers) to create a side- or top/bottom-remaining patterned film. This can increase throughput and avoid the problem associated with surface contamination as a result of exposure to the air.

Since the etch-selectivity varies depending on the deposited material properties, the selectivity also is expected to be a proxy for wet-etching, despite the fact that the actual selectivity difference between different-metal compounds and/or different-quality materials (including those of an elementally and/or compositionally same type) may differently manifest in the dry-etching process and in the wet-etching process. However, etch rate and wafer-to-wafer uniformity are more easily controllable for the dry-etch process.

Some embodiments involve highly selective dry-etching of SiN film for performing conformal etching or for creating top- or side-remaining structures by using fluorine radicals. This makes it possible to replace a wet-etching step that is typically used, by a dry-etching step. The dry-etch rate of SiN film is determinable as a function of the density, for example. A difference in dry-etching selectivity between SiN films with different film properties is required to create top- or side-remaining structures, as in wet-etching. Thus, by changing the density of SiN film on vertical surfaces and that on horizontal surfaces, the desired topology profile can be obtained (side- or top/bottom-remaining or a combination thereof). In dry-etching processes including conventionally used processes, oxides ($SiO_2$, $TiO_2$ and $ZrO_2$) also can manifest such high etching selectivity.

Further, the proposed dry-etching process can also make it possible to perform both deposition of SiN and etching in a same chamber or in a same cluster tool with multiple chambers, increasing throughput and avoid the problem associated with surface oxide formation as a result of exposure to the air. Also, etch rate and wafer-to-wafer uniformity can be more easily controllable in a dry etch process than in a wet etch process.

Additionally, some embodiments involve performing a deposition process and a dry-etching process in a single chamber or reactor, thereby resolving at least one of the problems discussed in this disclosure. Typically, such a method comprises: (1) depositing an insulating film on a patterned structure of a substrate by plasma-enhanced chemical vapor deposition (PECVD) or plasma-enhanced atomic layer deposition (PEALD) in a reaction chamber, wherein a portion of the film deposited on a horizontal surface and a portion of the film deposited on a vertical surface have different chemical resistance properties (in this disclosure, the "vertical" and "horizontal", or any similar words, are used as relative terms and are not intended to be limited to the exact direction of gravity and the exact direction orthogonal thereto, respectively, but they are referred to as any general direction substantially parallel to the direction of anisotropic ion bombardment or the direction of film thickness, and any general direction substantially orthogonal thereto, respectively); and then (2) in the same reaction chamber as in process (1), exposing the film deposited in process (1) to a remote plasma using a remote plasma system and performing isotropic dry etching to remove a part (a portion other than a target film-maintaining portion) of the film, thereby leaving a portion of the film substantially only on sidewalls of the patterned structure or only on top/bottom surfaces of the patterned structure.

In some aspects of the disclosed embodiments, by utilizing differences in etch selectivity between the first and second dielectric layers and by controlling directionality of etching, the target topology profile of the final layer structure can be achieved, whereas in some aspects of the disclosed embodiment, by utilizing differences in in-plane etch selectivity of the dielectric layer, the target topology profile of the final layer structure can be achieved.

In some embodiments, by manipulating process (a) and process (b) as shown in Table 1 below by way of example only, by controlling the directionality of deposition and also the directionality of etching, respectively, the desired target topology profile can be achieved as shown in Table 1. As shown in Table 1, in some embodiments, different operation schemes, or different combinations, in processes (a) and (b) may lead to the same or similar final topology profile type (a side-dominant type, conformal, type or top/bottom-dominant type, although the actual profile may be different), wherein there are multiple ways (combinations) to achieve the same or similar results with regard to a topology profile of the final layer structure. In Table 1, "T", "B", and "S" refer to "top", "bottom", and "side", respectively, and "Fig. #" denotes a figure number showing a final layer structure formed using the corresponding scheme. The term "conformal" refers a high conformality such as more than approximately 70% to 130% (e.g., 80% to 120%, 90% to 110%, most typically about 100%) in some embodiments. The term "predominant" refers to a substantial difference which is not conformal or is a material difference for the intended purposes such as a predominance by at least 40%, 50%, 100%, 200%, 500%, 1000%, or any ranges thereof in some embodiments. Also, the term "remaining" refers to the meaning of "predominant" in some embodiments. The term "low quality" refers to lower chemical resistance, e.g., higher dry etch rate, or lower density, relative to reference quality, in some embodiments. In this disclosure, any number which defines a numeric range, for example, is a representative number, average number, randomly selected number, median number, conventionally or commonly defined number, or any number equivalent thereto, depending on the context.

TABLE 1

| | Process (a) (deposition) | Process (b) (etching) | Final topology | FIG. # |
|---|---|---|---|---|
| 1 | Conformal/ uniform quality | T/B-predominant | S-remaining | 9 |
| 2 | Conformal/ uniform quality | Conformal | Conformal | 22B |
| 3 | Conformal/ T/B-low quality | Conformal | S-remaining | 12A |
| 4 | Conformal/ S-low quality | Conformal | T/B-remaining | 8A, 12B, 18A (left) |
| 5 | T/B-predominant/ uniform quality | Conformal | T/B-remaining | 21B |
| 6 | T/B-predominant/ T/B-low quality | Conformal | S-remaining | 18A (center, right) |

As discussed above, some embodiments provide a method for fabricating a layer structure having a target topology profile in a step which has a side face and a lateral face, comprising processes of: (a) depositing a dielectric layer on a preselected area of the substrate under first deposition conditions, wherein the dielectric layer has a portion whose resistance to fluorine and/or chlorine radicals under first dry-etching conditions is tuned; and (b) exposing the dielectric layer obtained in process (a) to the fluorine and/or chlorine radicals under the first dry-etching conditions, thereby removing at least a part of the portion of the dielectric layer, thereby forming a layer structure having the target topology profile on the substrate. In this disclosure, the chemical "resistance" of film can be evaluated based on etched thickness of the film per unit time under given dry-etching conditions, and "etch selectivity" (which may be referred to also as "etching rate selectivity") of a first film (or a first portion) relative to a second film (or a second portion) can be evaluated based on a ratio of the chemical resistance of the first film to that of the second film.

In some embodiments, the method further comprises processes of, prior to process (a): (i) providing reference deposition conditions and reference dry-etching conditions under which a layer structure having a reference topology profile is formed in the step on the substrate by conducting process (a) and process (b); (ii) upon comparing the thus-obtained reference topology profile with the target topology profile, changing at least one parameter of the reference deposition conditions and/or at least one parameter of the reference dry-etching conditions in a manner forming a layer structure having a topology profile in the step on the substrate, which is more similar to the target topology profile than is the reference topology profile; (iii) conducting process (a) and process (b) under the changed deposition/dry-etching conditions; and optionally (iv) repeating processes (ii) and (iii) until the thus-obtained topology profile is substantially equivalent to the target topology profile.

In some embodiments, the at least one parameter of the reference deposition conditions changed in process (ii) is at least one of plasma power, gas selection, gas flow rate, pressure, and temperature in a reaction space where process (a) is conducted. In some embodiments, the at least one parameter of the reference dry-etching conditions changed in process (ii) is at least temperature of a reaction space where process (b) is conducted.

The technology disclosed herein is widely applicable in various industries, which includes, but is not limited to, an application wherein the step having the side face and the lateral face is constituted by a trench having sidewalls as the side face, and a bottom face and a top face as the lateral face; an application wherein the step having the side face and the lateral face is a part of 3D NAND structure provided with a horizontal recess having a depth-direction face as the side face, and height-direction lower and upper faces as the lateral face; and an application wherein the step having the side face and the lateral face is a part of staircase having a height face as the side face and a depth face as the lateral face.

As discussed in this disclosure, the technology disclosed herein include various embodiments, and each embodiment can include one or two or more of the following features in any combination. Further, in this disclosure, in all of the explicitly, implicitly, or inherently disclosed features, any one or more of them used in an embodiment can interchangeably (or alternatively) or additionally be used in another embodiment unless stated otherwise or such a replacement or addition is not feasible or causes adverse effect or does not work for its intended purposes.

In an aspect, embodiments include, but are not limited to, at least one of the following features or two or more of the following features in any sensical combinations:

1) A method of selective dry-etching of two different materials (a first material and a second material) in terms of chemical resistance or etch selectivity, which materials are deposited on a patterned surface of a substrate, wherein the dry-etch etching process comprises exposing the patterned surface conformally to fluorine and/or chlorine radicals that are generated from an etching gas.

2) The method of 1) wherein the etch selectivity of the first and that of the second materials are differently adjusted by changing:
   a. the substrate temperature during the etching process; and/or
   b. the film quality of each of the first and second materials deposited on the patterned surface.

3) The method of 2) wherein the material quality is adjusted by varying material deposition parameters including:
   a. plasma conditions such as RF power, bias power, etc.;
   b. selection of a process gas including a precursor gas;
   c. gas flow of the process gas;
   d. the total gas pressure in a reaction chamber for the deposition process; and/or
   e. the substrate temperature during the deposition process.

4) The method of 1) wherein the first and/or second material are/is constituted by a metal-oxide, metal-nitride, metal-carbide, or a combination thereof (e.g., TiO, ZrO, TiN, MoO, MoC, TiCO, etc.).

5) The method of 1) wherein the first material is constituted by a metal-compound material and the second material is constituted by SiO.

6) The method of 1) wherein the first material is constituted by TiO and the second material is constituted by SiO or SiN.

7) The method of 1) wherein the first material has lower quality than the second material in terms of chemical resistance.

8) The method of 1) wherein the process gas contains F and Ar.

9) The method of 1) wherein the process gas contains F, N, and O.

10) The method of 1) wherein the process gas contains Cl.

11) The method of 1) wherein the radicals are generated using:
   a. a remote plasma source (e.g., microwave plasma, CCP, ICP); or
   b. a thermal decomposition process (e.g., hot wire).

12) The method of 1) wherein a reaction chamber for the etching process is clustered with the reaction chamber for the deposition process, and the deposition process and the etching process are sequentially and continuously conducted without breaking a vacuum.

13) The method of 1) wherein the deposition process and the etching process are performed in a same reaction chamber.

In another aspect, embodiments include, but are not limited to, at least one of the following features or two or more of the following features in any sensical combinations:

1) A method of highly-selective dry-etching of SiN film relative to another film constituted by another material, which films are deposited on a patterned surface of a substrate, wherein the dry-etching process comprises exposing the patterned surface conformally to fluorine and/or chlorine radicals that are generated from an etching gas.

2) The method of 1) wherein the other material is SiN which is different from SiN constituting the SiN film in terms of film quality such as the film density and/or film composition, and the etching gas is a fluorine-containing gas such as $SF_6$ or $NF_3$.

3) The method of 1) wherein the highly selective dry-etching is conducted to the SiN film deposited on a step structure of the patterned surface, and a desired portion of the SiN film is selectively removed relative to the remaining portion of the SiN film due to their difference of film quality.

4) The method of 1) wherein the other material is a dielectric material such as $SiO_2$, SiC, SiCO, Ti oxide, Hf oxide, and/or Zr oxide.

5) The method of 1) wherein the etching gas contains F and Ar.

6) The method of 1) wherein the etching gas contains F, N and O.

7) The method of 1) wherein the etching process uses Cl radicals, rather than F radicals.

8) The method of 1) wherein the radicals are generated using:
   a. a remote plasma source (e.g., microwave plasma, CCP, ICP); or
   b. a thermal decomposition process (e.g., hot wire).

9) The method of 2) wherein the etch selectivity of the SiN constituting the SiN film and that of the SiN constituting the another film are differently adjusted by changing the following process conditions:
   a. plasma conditions such as RF power, bias power, etc.;
   b. selection of a process gas including a precursor gas;
   c. gas flow of the process gas;
   d. the total gas pressure in a reaction chamber for the deposition process; and/or
   e. the substrate temperature during the deposition process.

10) The method of 1) wherein the etch selectivity of the SiN film relative to that of the another film which is oxide (SiO, TiO, ZrO) is adjusted by changing the following conditions:
   a. the film density of the SiN film relative to that of the oxide;
   b. selection of a process gas including a precursor gas;
   c. plasma conditions such as RF power, bias power, etc.;
   d. the gas flow of the process gas;
   e. the total gas pressure in a reaction chamber for the deposition process; and/or
   f. the substrate temperature during the deposition process.

11) The method of 1) wherein a reaction chamber for the etching process is clustered with the reaction chamber for the deposition process, and the deposition process and the etching process are sequentially and continuously conducted without breaking a vacuum.

12) The method of 4) wherein the etch selectivity of the SiN and that of the another film are adjusted by changing the process temperature during the deposition process.

In yet another aspect, embodiments include, but are not limited to, at least one of the following features or two or more of the following features in any sensical combinations:

1) A method of tuning a topology profile of a film formed on a patterned surface of a substrate, which patterned surface is constituted by a step structure composed of a horizontal surface (typically a top surface and a bottom surface of a recess) and a vertical surface (typically sidewalls of the recess), the method comprising: (1) depositing a film on the patterned surface of the substrate in a reaction chamber in a manner that a portion of the film deposited on the horizontal surface and a portion of the film deposited on the vertical surface have different chemical resistance properties; and (2) subjecting the film to isotropic dry etching in the reaction chamber in a manner (a) removing predominantly the portion of the film deposited on the horizontal surface so as to leave predominantly or substantially solely the portion of the film deposited on the vertical surface, or (b) removing predominantly the portion of the film deposited on the vertical surface so as to leave predominantly or substantially solely the portion of the film deposited on the horizontal surface.

2) The method of 1) wherein the isotropic dry etching is conducted using a remote plasma system.

3) The method of 1) wherein the film is an insulating film.

4) The method of 3) wherein the insulating film is constituted by SiN or SiO.

5) The method of 3) wherein the insulating film is deposited using a capacitively coupled plasma (CCP).

6) The method of 4) wherein the insulating film is a SiN film which is deposited using at least one precursor selected from the group consisting of aminosilane, halogenated silane, mono-silane, and di-silane.

7) The method of 3) wherein the insulating film is subjected to the dry etching in process (b) which uses a fluorine-containing dry gas such as $NF_3$ and/or $CF_4$ as an etchant, and a dilution gas such as Ar, $N_2$, and/or He.

8) The method of 1) wherein the film is deposited in process (a) by plasma-enhanced chemical vapor deposition (PECVD), plasma-enhanced atomic layer deposition (PEALD), or high-density plasma chemical vapor deposition (HDPCVD).

In some embodiments, a remote plasma is used for dry etching of the film in process (b), which is commonly or conventionally used for chamber cleaning. The use of a remote plasma for dry etching of the film yields significant advantages including high productivity, i.e., high etch rate which is remarkably higher than that of wet etching. Since the etch rate of the remote plasma dry etching is high, in order to improve controllability of etch rate of the remote plasma dry etching, the concentration or flow rate of an etchant such as $NF_3$, for example, may be set at a value lower than (e.g., 10% to 90%, 30% to 70%, or about 50% of) that normally used for chamber cleaning. Further, when the film is deposited along surfaces of a trench, the aspect ratio of the trench may affect controllability of isotropic dry etching. In order to alleviate such a problem, etch selectivity of the sidewall portion relative to the top/bottom portion of the film deposited in the trench, for example, may be tuned by adjusting the film quality of these portions, differently, by changing the deposition pressure, for example, in process (a) (deposition process).

Some aspects and/or embodiments of the present invention will be explained in detail with reference to the drawings by way of examples, but the present invention is not intended to be limited thereto.

Figure 23:
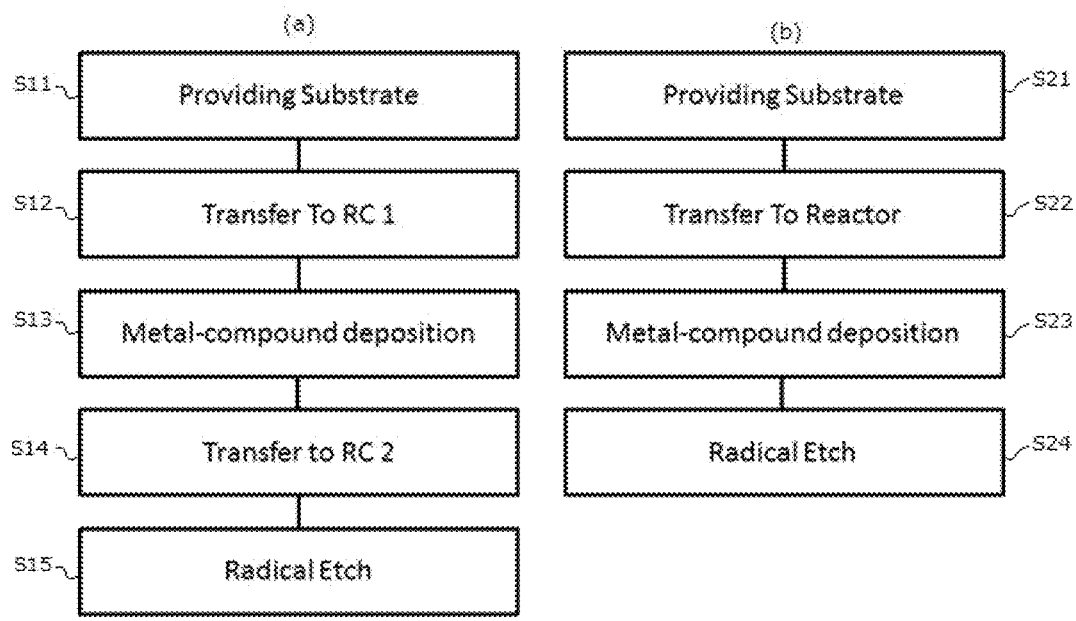
FIG. 23 shows, by way of example, a schematic simplified continuous process scheme (a) combining deposition and etching in a cluster tool without breaking a vacuum and a schematic simplified continuous process scheme (b) performing deposition and etching in a same reactor.

FIG. 23 represents some aspects of embodiments and shows a schematic simplified continuous process scheme (a) combining deposition and etching in a cluster tool without breaking a vacuum and a schematic simplified continuous process scheme (b) performing deposition and etching in a same reactor. In process scheme (a), in step S11, a substrate is provided ("Providing Substrate"), which has a patterned surface constituted by at least one step which has a side face (which may be referred to as "a vertical face" or "a sidewall") and a top face (which may be referred to as "a horizontal face" or "a top/bottom face"). In step S12, the substrate is transferred to a reactor chamber 1 ("Transfer to RC 1") for deposition. A first dielectric layer (constituted by, e.g., SiO material or other oxide material) may be formed already on the substrate before transferring the substate to the reaction chamber 1 or may be formed in the reaction chamber 1, whereby the surface of the step is constituted by the first dielectric layer before depositing a second dielectric layer in the reaction chamber 1. In step S13, in the reaction chamber 1, the second dielectric layer composed of a metal compound (which herein includes not only e.g., TiO, TiN, but also a metalloid compound and silicon compound, e.g., SiN) is deposited ("Metal-compound deposition") on a preselected area of the first dielectric layer in a manner directly contacting the first dielectric layer under deposition conditions. The second dielectric layer has lower resistance to fluorine and/or chlorine radicals than does the first dielectric layer.

In step S14, upon completion of deposition of the second dielectric layer in the reaction chamber 1, the substrate is transferred to a reaction chamber 2 ("Transfer to RC2") for dry etching which may be attached to a wafer transfer chamber with a wafer handling robot, to which the reaction chamber 1 is also attached, so that the substrate may be transferred to the reaction chamber 2 without being exposed to the air. In step S15, the second dielectric layer is exposed to the fluorine and/or chlorine radicals under dry-etching conditions ("Radical Etch"), thereby removing at least a part of the second dielectric layer without removing the first dielectric layer, thereby forming a layer structure having a topology profile on the substrate. Radical etching may be isotropic etching using primarily or predominantly radicals rather than ions (preferably substantially no or little ions) so that substantially conformal etching can be performed (i.e., substantially no or little directionality of etching) when the second dielectric layer is conformal and has homogenous (in-plane quality uniformity), resulting in a conformal final layer structure, whereas radical etching may function as anisotropic etching when the second dielectric layer is not conformal (e.g., top-predominant deposition) and/or has an in-plane quality variation (e.g., side-low quality), resulting in a final layer structure having a top-remaining topology profile or a side-remaining topology profile. Radical etching is similar to wet etching but is much faster etching than wet etching.

In process scheme (b) in FIG. 23, the deposition process and the etching process are conducted in the same reaction chamber. This simplified process scheme (dep+etch process flow) allows for SiN pattern definition (side-remaining or top-remaining) without breaking a vacuum. In process scheme (b), steps S21, S22, S23, and S24 correspond to steps S11, S12, S13, and S15 in process scheme (a), wherein in process scheme (b), there is no step corresponding or equivalent to step S14.

Process scheme (b) can be achieved using the following reactor design in some embodiments, which is shown solely by way of example. For radical etching, a plasma is not in direct contact with a substrate in a reaction chamber. In some embodiments, a possible plasma source is a remote plasma which may be a capacitively coupled plasma (CCP), inductively coupled plasma (ICP), or microwave plasma (MWP). Thus, an in-situ CCP, where two electrodes are parallelly provided in a chamber and a substrate is placed between the two electrodes, is not suitable for radical etching.

Figures 11A, 11B:
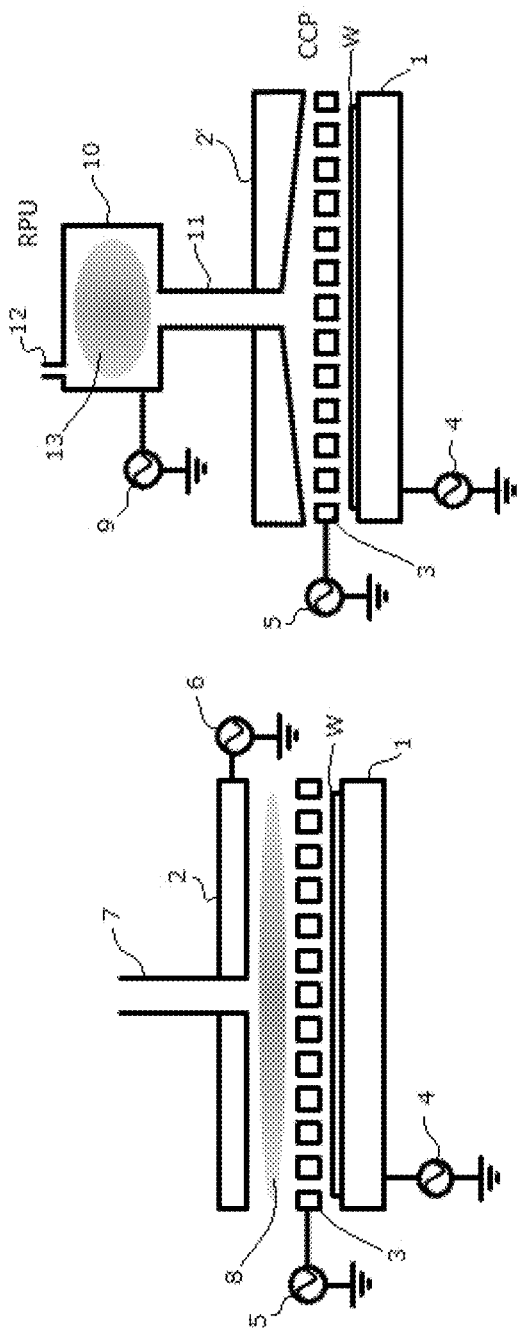
FIG. 11A shows, by way of example, a schematic simplified configuration of a remote plasma processing apparatus wherein a remote plasma source is integrated in a main process chamber.
FIG. 11B shows, by way of example, a schematic simplified configuration of a remote plasma processing apparatus wherein a remote plasma is generated remotely, and reactive species are fed into a reaction chamber.

FIG. 11A shows a schematic simplified configuration of a remote plasma processing apparatus wherein a remote plasma source is integrated in a main process chamber. FIG. 11B shows a schematic simplified configuration of a remote plasma processing apparatus wherein a remote plasma is generated remotely, and reactive species are fed into a reaction chamber. The generation of the F-radicals can be performed by, for example, inductively coupled plasma (ICP), capacitively coupled plasma (CCP), or microwave plasma. In both apparatuses illustrated in FIGS. 11A and 11B, for conducting deposition, an in-situ CCP is used by generating a plasma between an upper electrode (showerhead) 3 an a lower electrode (susceptor) 1 on which a wafer (W) is placed, wherein the upper electrode 3 is connected to an RF power source 5 whereas the lower electrode 1 is connected to a low-frequency bias source 4. For conducting radical etching, the apparatus illustrated in FIG. 11A uses an indirect plasma 8 which is generated between a top electrode 2 connected to a plasma power source 6 (RF power source or microwave power source, for example) and the upper electrode 3. Since the plasma 8 is confined in the space between the top electrode 2 and the upper electrode 3, the wafer (W) is not exposed directly to the plasma, but is exposed to radicals of the plasma which are fed and pass through the upper electrode 3 and reach the surface of the wafer (W). To the top electrode, a gas supply line 7 is connected for feeding a process gas for deposition and/or an etchant gas for dry etching.

For conducting radical etching, the apparatus illustrated in FIG. 11B uses a remote plasma unit 10 which generates a plasma 13 inside the remote plasma unit 10 to which an etchant gas is fed through a gas line 12 and which is connected to a plasma power source 9. Since the plasma 13 is confined in the remote plasma unit 10, the wafer (W) is not exposed directly to the plasma, but is exposed to radicals of the plasma which are fed and travel through a gas line 11 connected to an upper plate 2' and through the upper electrode 3 (showerhead), reaching the surface of the wafer (W). When conducting deposition of a film, the remote plasma unit 10 is not activated, and a process gas is fed to a reaction space between the upper and lower electrodes through the gas line 12, the remote plasma unit 10, the gas line 11, and the upper electrode (showerhead) 3.

Figure 14:
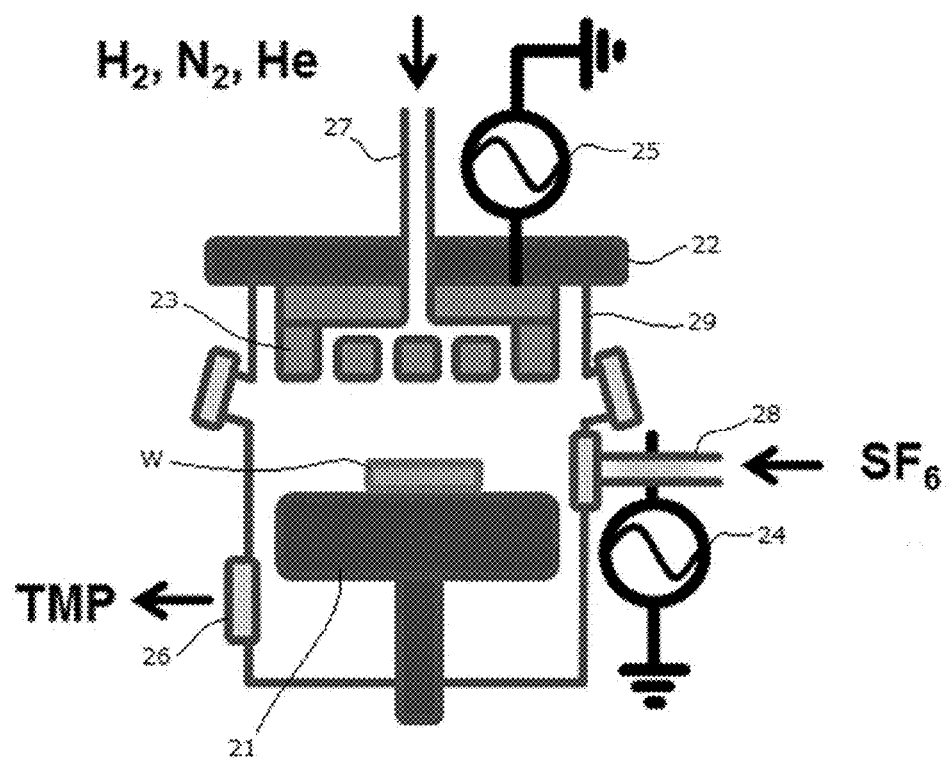
FIG. 14 shows, by way of example, a schematic simplified configuration of a plasma processing apparatus equipped with an RF plasma source for deposition and a MW plasma source for dry etching.

FIG. 14 shows, by way of example, a schematic simplified configuration of a plasma processing apparatus equipped with an RF plasma source for deposition and a MW plasma source for dry etching, wherein a MW plasma for dry etching is supplied through a port provided on a sidewall of a reaction chamber 29 to a reaction space wherein a wafer (W) is placed on a susceptor 21. The MV plasma is generated by a remote plasma unit 28 connected to a MW power source 24, through which an enchant gas (e.g., SF$_6$) fed thereto becomes radicals which are supplied to the reaction space for dry etching of the wafer surface. For deposition of a film on the wafer (W), any suitable CCP system, for example, can be used, including any suitable conventional CCP system wherein an RF power source 25 and a gas line 27 are connected to a showerhead (upper electrode) 23 provided on a top pane 22. The gas line 27 is utilized for feeding an inert gas (e.g., H$_2$, N$_2$, and/or He) not only for deposition but also for dry etching as necessary. The susceptor functions as a lower electrode and is grounded for deposition. The pressure inside the reaction chamber 29 is controlled by discharging the gas from the reaction space through a port 26 which is connected to a TMP (turbo molecular pump) for a high vacuum.

Figure 17:
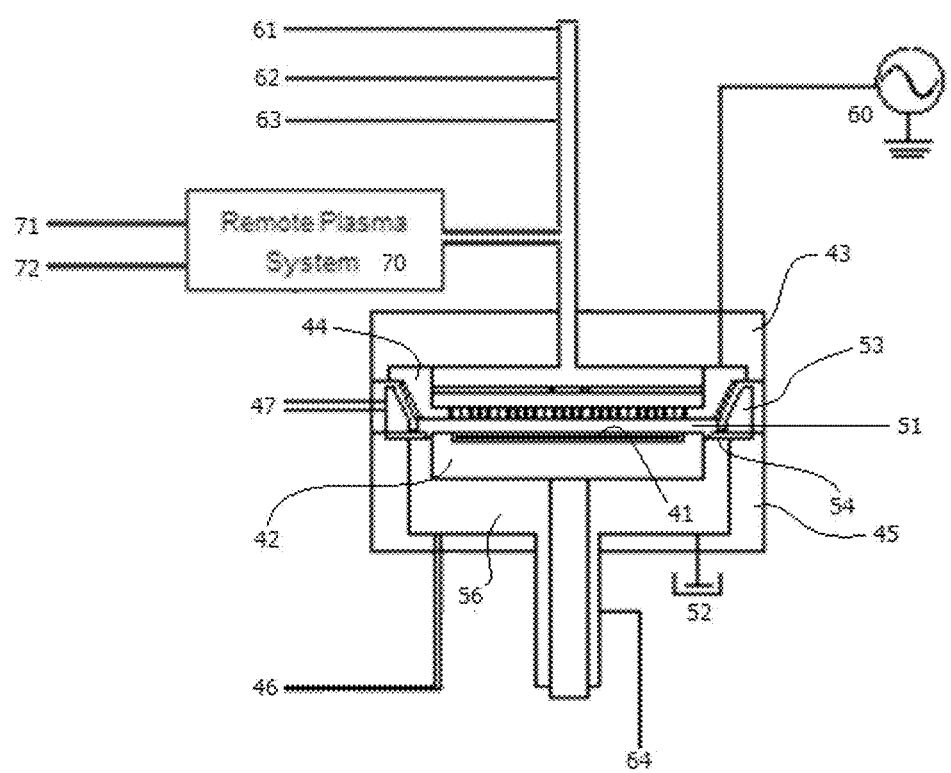
FIG. 17 shows, by way of example, a schematic simplified configuration of a plasma processing apparatus equipped with an RF plasma source and a remote plasma source.

FIG. 17 shows, by way of example, a schematic simplified configuration of a plasma processing apparatus equipped with an RF plasma source and a remote plasma source. This is a variation of a system using a remote plasma unit as with the apparatus illustrated in FIG. 11B. This apparatus is desirably in conjunction with controls programmed to conduct the sequences described below. In this figure, by providing a pair of electrically conductive flat-plate electrodes 44, 42 in parallel and facing each other in the interior 51 (reaction zone) of a reaction chamber 43, applying HRF power (13.56 MHz or 27 MHz) 60 to one side, and electrically grounding the other side 52, a plasma is excited between the electrodes. A temperature regulator is provided in a lower stage 42 (the lower electrode), and a temperature of a substrate 41 placed thereon is kept constant at a given temperature. The upper electrode 44 serves as a shower plate as well, and reactant gas (and noble gas) and precursor gas are introduced into the reaction chamber 43 through a gas line 61 and a gas line 62, respectively, and through the shower plate 44. Additionally, in the reaction chamber 43, a circular duct 53 with an exhaust line 47 is provided, through which gas in the interior 51 of the reaction chamber 43 is exhausted. Additionally, a dilution gas is introduced into the reaction chamber 43 through a gas line 63. Further, a transfer chamber 45 disposed below the reaction chamber 43 is provided with a seal gas line 64 to introduce seal gas into the interior 51 of the reaction chamber 43 via the interior 56 (transfer zone) of the transfer chamber 45 wherein a separation plate 54 for separating the reaction zone and the transfer zone is provided (a gate valve through which a wafer is transferred into or from the transfer chamber 45 is omitted from this figure). The transfer chamber is also provided with an exhaust line 46. In some embodiments, the deposition of multi-element film and surface treatment are performed in the same reaction space, so that all the steps can continuously be conducted without exposing the substrate to air or other oxygen-containing atmosphere. In some embodiments, a remote plasma unit can be used for exciting a gas. Upon completion of film deposition on the patterned surface of the wafer, dry etching begins using a remote plasma system 70 which is connected to a gas line connected to the showerhead 44 downstream of the gas lines 61, 62, 63. To the remote plasma system 70, an enchant gas and an inert gas are supplied through gas lines 71, 72, respectively, so that the enchant gas is excited, generating a plasma including radicals which are fed to the reaction zone 51 for dry etching.

In some embodiments which are illustrated in (b) in FIG. 23, since dry etching uses radicals included in a remote plasma for adjusting the topology profile of a layer structure formed in a step of a substrate, the deposition process and the dry etching process can be conducted in a same reaction chamber if it is equipped with proper plasma sources for deposition and for dry etching. The foot print of such an apparatus can be significantly smaller than that when using conventional separate reaction chambers for deposition and for wet etching, and the throughput can also significantly improve because dry etching is much faster (having much higher etching rate) than wet etching. Conventionally, some apparatuses are equipped with a remote plasma unit for chamber cleaning. However, since the remote plasma unit is provided exclusively for chamber cleaning, (1) a cleaning cycle is periodically or intermittently conducted according to its set cleaning schedule for maintenance purposes, and it is not conducted after every deposition cycle; (2) the cleaning conditions are set constantly for most effectively cleaning inner walls, showerhead, and susceptor in the chamber, and are not at all tuned to specifically adjust a topology profile of an individual layer structure formed in a recess of a substrate so as to achieve a target topology profile of a final layer structure; and (3) the plasma density used for chamber cleaning is high to effectively remove particle layers formed on inner surfaces of the chamber which are often visible and thus requires at least micro-meter order control, far more than nano-meter order control, since the particle layers has a micro-meter order thickness (at least one micrometer), which is too high for adjusting the topology profile of a film or layer which requires nano-meter order control (less than one micro-meter control, preferably adjusting thickness if 100 nm, 50 nm, 20 nm, 10 nm, or less). Further, suitable plasma-generating frequency for chamber cleaning is not the same as that for adjusting a topology profile of a layer structure of a substrate. In some embodiments of the present invention, the deposition process and the dry etching process as a whole are tuned and controlled as an integrated process according to the target topology profile of a final layer structure.

Figure 15:
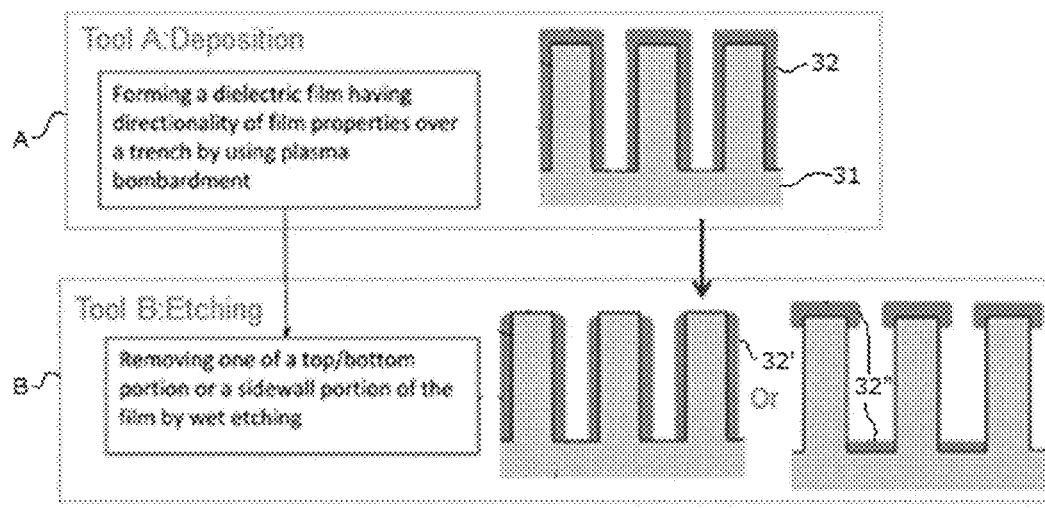
FIG. 15 shows, by way of example, a process using an apparatus for deposition and another apparatus for wet etching.
Figure 16:
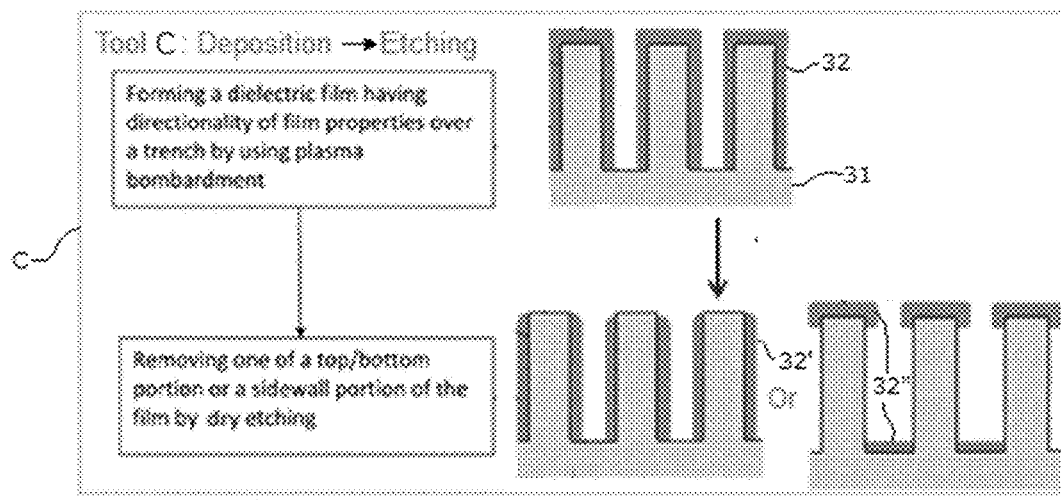
FIG. 16 shows, by way of example, a process using a single apparatus for deposition and dry etching.

FIG. 15 shows, by way of example, a process using an apparatus for deposition and another apparatus for wet etching. FIG. 16 shows, by way of example, a process using a single apparatus for deposition and dry etching. In both process schemes illustrated in FIGS. 15 and 16, the deposition process may be conducted similarly, wherein a substrate 31 having trenches is placed in a reaction chamber (Tool A in FIG. 15, Tool C in FIG. 16), forming a dielectric film 32 having directionality of film properties over the trenches by using plasma bombardment. The directionality of film properties refers to, but are not limited to, a difference in properties such as chemical resistance (chemical difference), density (mechanical difference), thickness (structural difference), and/or composition (compositional difference) between a portion of the film on a horizontal surface and a portion of the film on a vertical surface, all of which are associated with etch selectivity. Any suitable methods including any suitable conventional methods or those explicitly, implicitly, or inherently described in this disclosure can be used. For example, in some embodiments, such methods disclosed in U.S. Pat. No. 9,754,779 issued Sep. 5, 2017, U.S. Pat. No. 10,468,251 issued Nov. 5, 2019, and U.S. Pat. No. 10,529,554 issued Jan. 7, 2020 can be used, each disclosure of which is herein incorporated by reference in its entirety. In both FIGS. 15 and 16, the film 32 deposited on the substrate 31 is conformal but has directionality in terms of wet etching properties in FIG. 15 and dry etching properties in FIG. 16.

For etching, in FIG. 15, the substrate 31 is transferred to another reaction chamber (Tool B; wet etching apparatus) to remove one of a top/bottom portion, resulting in a side-remaining topology profile 32', or a sidewall portion of the film, resulting in a top/bottom-remaining topology profile 32", by wet etching, whereas in FIG. 16, the substrate 31 is not transferred to another reaction chamber but stays in the same reaction chamber (Tool C, dual functional apparatus) to remove one of a top/bottom portion, resulting in a side-remaining topology profile 32', or a sidewall portion of the film, resulting in a top/bottom-remaining topology profile 32", by dry etching. In FIG. 16, because the dry etching is conducted in the same reaction chamber, the footprint of the reaction chamber is not increased, and the throughput is high (high etch rate and no deadtime for transfer), whereas in FIG. 15, because the wet etching is conducted in the other reaction chamber, the footprint of the two reaction chambers is double, and the throughput is low (low etch rate and time required for transfer).

Figure 7:
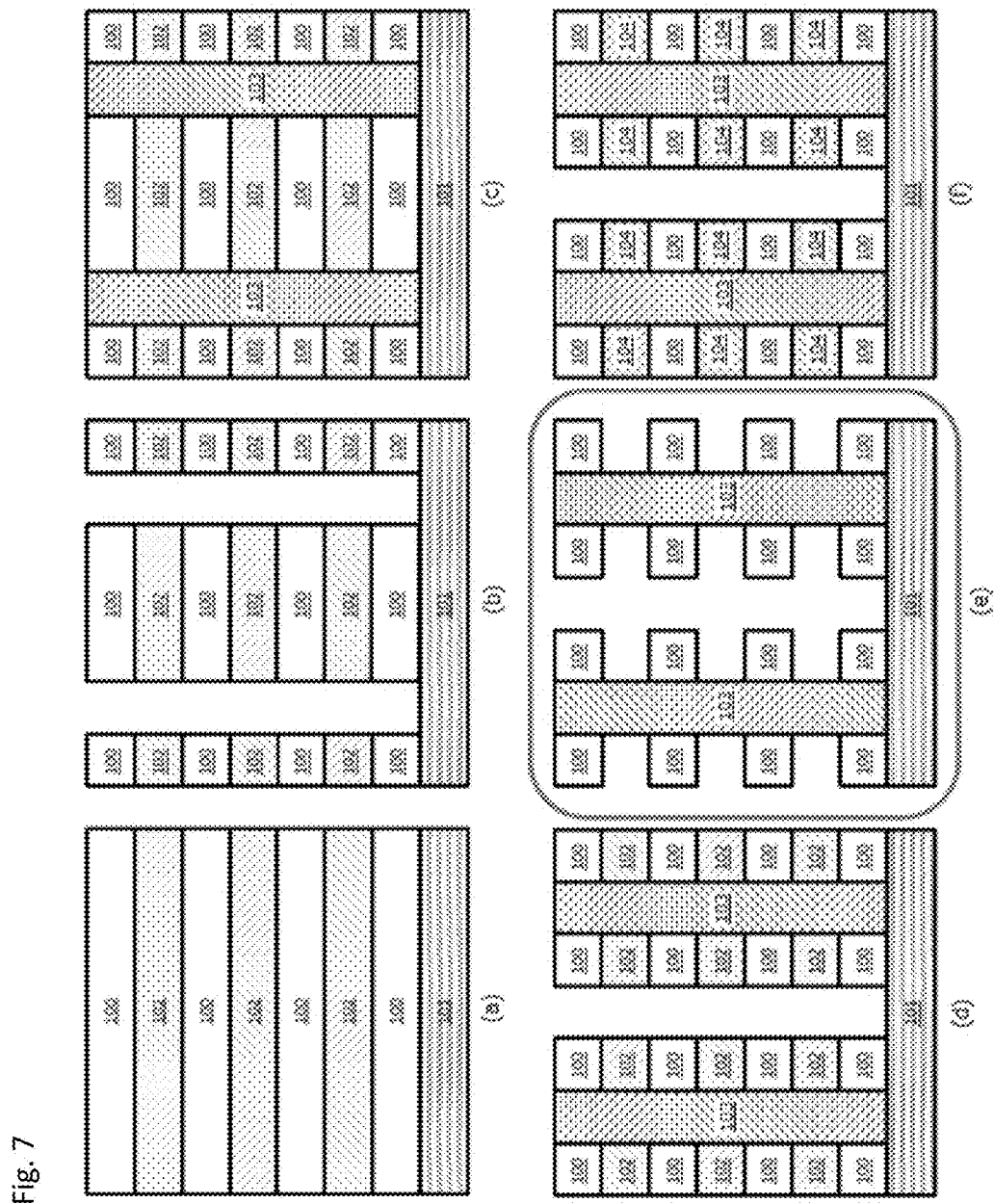
FIG. 7 shows, by way of example, a schematic simplified process sequence ((a)→(b)→(c)→(d)→(e)→(f)) in 3DNAND fabrication using fluorine radicals.

In some embodiments, the combined process of deposition and dry etching utilizing effective dry etch selectivity of two layers may be suitably applied to 3DNAND fabrication. FIG. 7 shows, by way of example, a schematic simplified process sequence ((a)→(b)→(c)→(d)→(e)→(0)) in 3DNAND fabrication using fluorine radicals. Structure (e) enclosed with lines provides representation of a removal step of a sacrificial layer (e.g., SiN 102) with high desired etch selectivity over an insulating layer (e.g., $SiO_2$ 100) (>e.g., 1000:1) wherein the process described in this disclosure using fluorine radicals is used during this removal step in place of the conventional wet etching. Typical layers as well as typical dimensions of the layers are indicated, by way of example, as follows: 100: Insulating layer ($SiO_2$ 30 nm thickness, deposited by PECVD); 101: Substrate; 102: Sacrificial Layer (SiN 30 nm thickness, deposited by PECVD); 103: Chanel (Poly-Si with $SiO_2$ Fill); 104: Metal contact (TiN diffusion Barrier/W fill). In this figure, structure (a) provides representation of SiO/SiN stack formation; structure (b) provides representation of via etching 100 nm in diameter; structure (c) provides representation of via filling with poly-Si/$SiO_2$; structure (d) provides representation of via etching; structure (e) provides representation of sacrificial SiN removal ($NF_3$/$SF_6$ Radical dry etching); and structure (f) provides representation of metal contact formation.

Figure 8A:
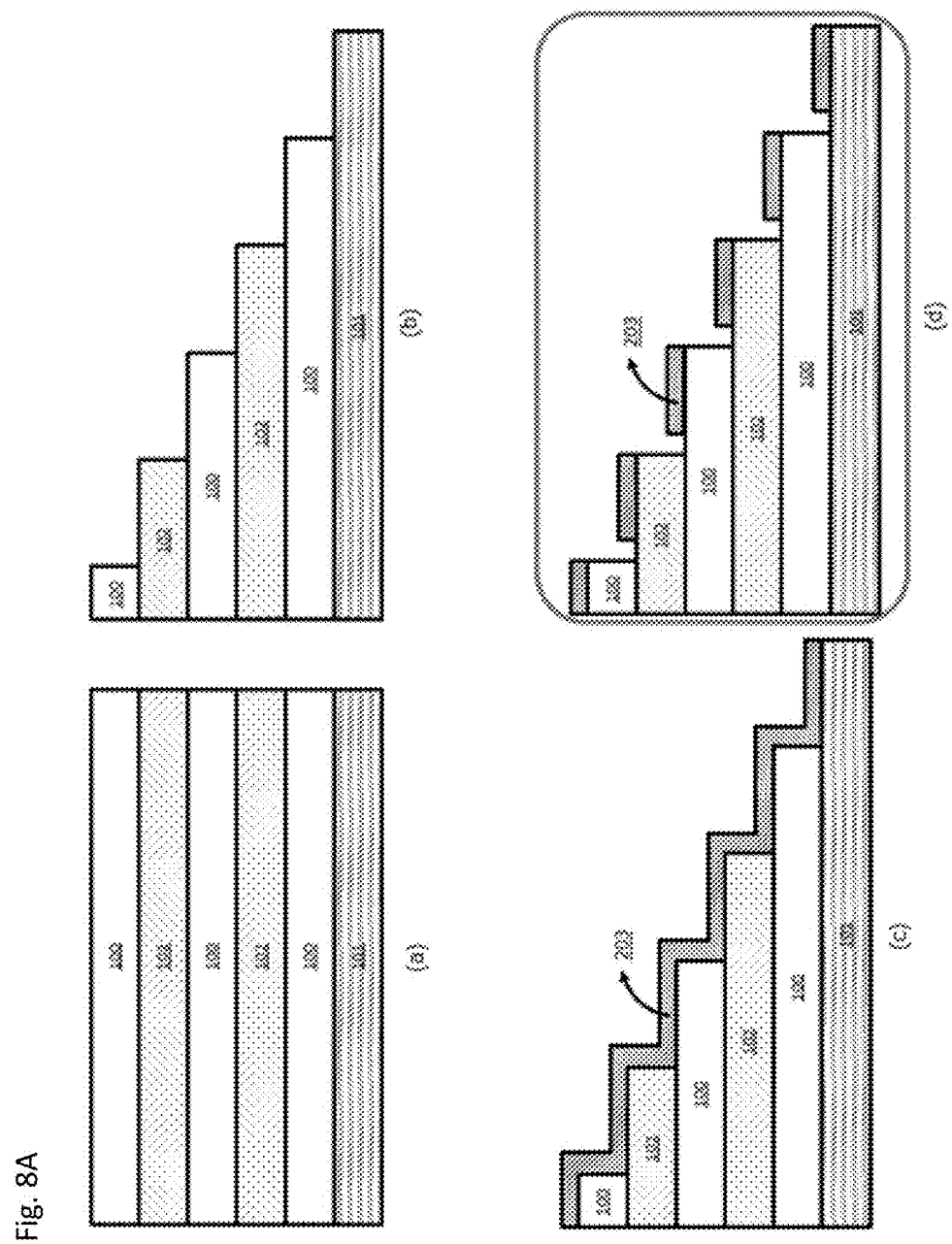
FIG. 8A shows, by way of example, a schematic simplified process sequence ((a)→(b)→(c)→(d)) in 3DNAND fabrication on a "staircase" using fluorine radicals.
Figure 8B:
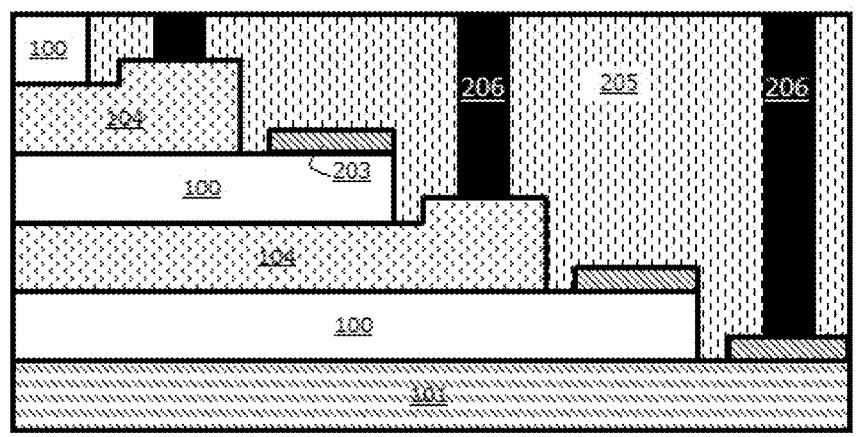
FIG. 8B shows, by way of example, a final structure manufactured using the process sequence of FIG. 8A.

FIG. 8A shows, by way of example, a schematic simplified process sequence ((a)→(b)→(c)→(d)) in 3DNAND fabrication on a "staircase" using fluorine radicals. FIG. 8B shows, by way of example, a final structure manufactured using the process sequence of FIG. 8A. Structure (d) enclosed with lines provides representation of top-remaining etching of a sacrificial layer (e.g., SiN 203). Because the film quality of the sacrificial layer on the vertical surfaces (sidewalls) is significantly lower than on that on the horizontal surfaces (top, bottom), this quality difference (e.g., the difference in chemical resistance may be attributed to a difference in density and/or composition, etc.) results in selective etching of the sidewall portion over the top/bottom portion when using F-radicals. The quality difference between the top/bottom portion of the film and the sidewall portion of the film can be provided by changing SiN film deposition parameters as explained in this disclosure. Typical layers as well as typical dimensions of the layers are indicated, by way of example, as follows: 100: Insulating layer ($SiO_2$ 30 nm thickness); 101: Substrate; 102: Sacrificial Layer (SiN Type 1 30 nm thickness, deposited by PECVD); 104: Metal contact (TiN diffusion Barrier/W fill); 203: Sacrificial Layer (SiN Type 2 10 nm thickness, deposited by PEALD using $NH_3$ and DCS); 205: Insulating layer ($SiO_2$ 1000 nm thickness, deposited by PECVD); 206: Metal contacts (TiN diffusion barrier, W fill). Structure (a) provides representation of SiN/SiO stack formation; structure (b) provides representation of staircase formation; structure (c) provides representation of sacrificial SiN deposition; and structure (d) provides representation of top-remaining etching of SiN ($NF_3$/$SF_6$ radical etching). FIG. 8B provides representation of further processing till final structure.

Figure 9:
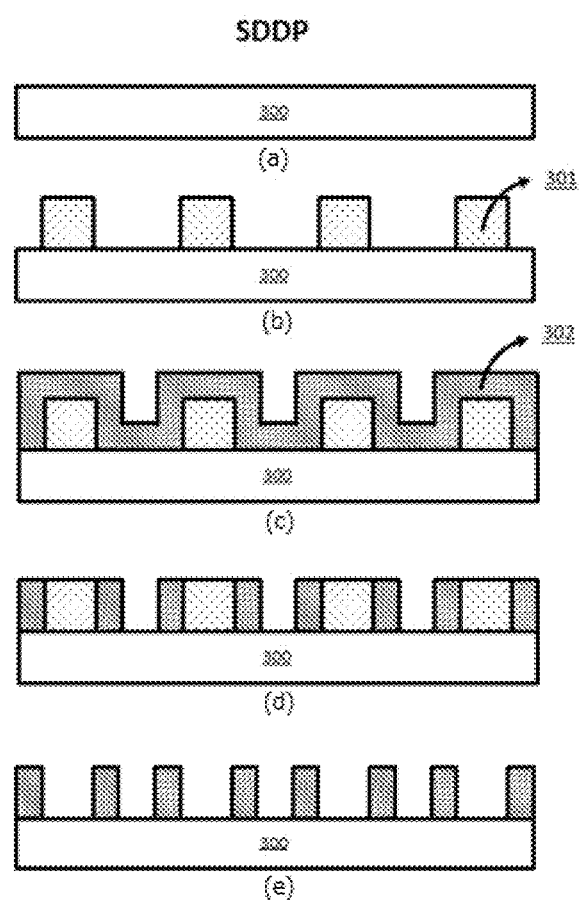
FIG. 9 shows, by way of example, a schematic simplified process sequence ((a)→(b)→(c)→(d)→(e)) in side-wall spacer formation or spacer defined double patterning (SDDP) using fluorine radicals.

FIG. 9 shows, by way of example, a schematic simplified process sequence ((a)→(b)→(c)→(d)→(e)) in side-wall spacer formation or spacer defined double pattering (SDDP) using fluorine radicals. Similar to FIG. 8, there are also applications where a side-remaining SiN film is required. By ensuring that film density and/or quality of a portion of SiN film deposited on sidewalls and/is higher than those deposited on top and bottom, etch selectivity of the sidewall portion over that of the top/bottom portion when using F-radicals can be achieved. By tuning the compositional differences, the desired thickness and properties of the remaining film can be achieved. This technology can effectively be used for side-wall spacer formation or spacer defined double pattering (SDDP). Typical layers as well as typical dimensions of the layers are indicated, by way of example, as follows: 300: Substrate Material; 301: Core Material; 302: SiN (vertical film different from top film quality (composition and/or density). The quality of the film (SiN 302) on the horizontal surfaces (top, bottom) is significantly lower than that on the vertical ones (side walls). This quality difference (e.g., the difference in chemical resistance may be attributed to a difference in density and/or composition, etc.) results in selective etching of the top portion over the sidewall portion when using F-radicals. Structure (b) provides representation of pattern formation; structure (c) provides representation of sacrificial SiN deposition; structure (d) provides representation of side-remaining (top/bottom-predominant) etching of SiN by $NF_3$ RPU with PR power (high etch selectivity of >e.g., 1000 of SiN over $SiO_2$ is obtained); and structure (e) provides representation of core etching (optional).

Figure 10:
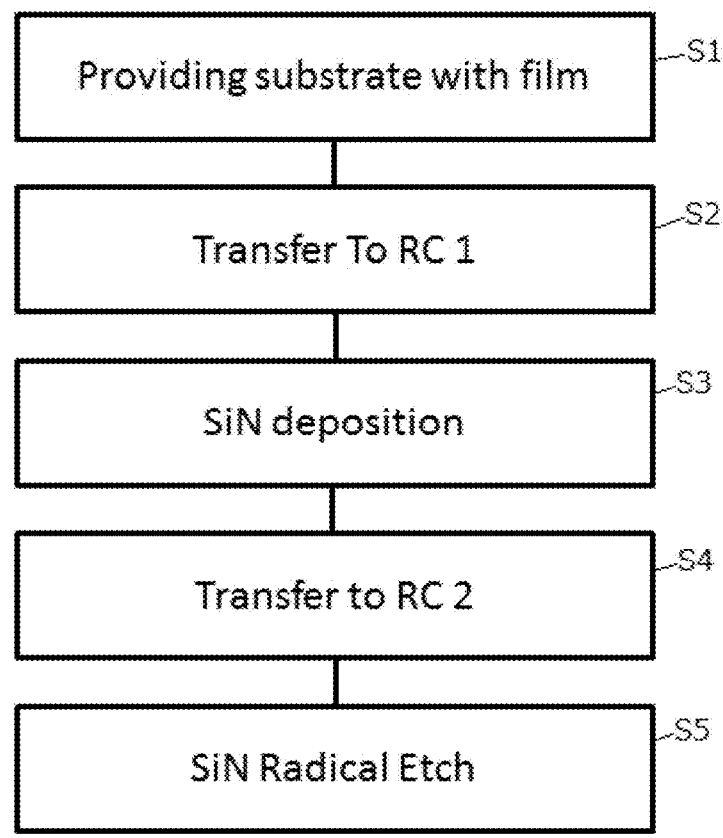
FIG. 10 shows, by way of example, a schematic simplified continuous process scheme combining deposition and etching in a cluster tool without breaking a vacuum.

FIG. 10 shows a schematic simplified continuous process scheme combining deposition and etching in a cluster tool without breaking a vacuum. This process scheme is substantially equivalent to that illustrated in (a) in FIG. 23, wherein steps S1, S2, S3, S4, and S5 correspond to S11, S12, S13, S14, and S15 in (a) in FIG. 23, respectively, except that the deposited film is particularly constituted by SiN in FIG. 10 whereas the deposited film is constituted by metal-compound in FIG. 23. The process scheme illustrated in (b) in FIG. 23 can also be applied to the SiN film.

A skilled artisan will appreciate that the apparatus includes one or more controller(s) (not shown) programmed or otherwise configured to cause the deposition and reactor cleaning processes described elsewhere herein to be conducted. The controller(s) are communicated with the various power sources, heating systems, pumps, robotics, and gas flow controllers or valves of the reactor, as will be appreciated by the skilled artisan.

The present invention is further explained with reference to working examples below. However, the examples are not intended to limit the present invention. In the examples where conditions and/or structures are not specified, the skilled artisan in the art can readily provide such conditions and/or structures, in view of the present disclosure, as a matter of routine experimentation. For example, in the following examples, any suitable precursors used for depositing dielectric films constituted by $TiO_2$, TiN, or the like, such as those disclosed in U.S. Pat. No. 9,556,516 issued Jan. 31, 2017, and/or U.S. Pat. No. 9,171,716 issued Oct. 27, 2015, can be selected and used by the skilled artisan as a matter of routine experimentation, each disclosure of which is herein incorporated by reference in its entirety. Also, for example, in the following examples, any suitable precursors used for depositing dielectric films constituted by $SiO_2$, SiN, or the like, such as those disclosed in U.S. Pat. No. 8,197,915 issued Jun. 12, 2012 and U.S. Pat. No. 9,824,881 issued Nov. 21, 2017, can be selected and used by the skilled artisan as a matter of routine experimentation, each disclosure of which is herein incorporated by reference in its entirety. Also, the numbers applied in the specific examples can be modified by a range of at least ±50% in some embodiments, and the numbers are approximate.

EXAMPLES

Reference Example 1

A $TiO_2$ film was deposited on each substrate by PEALD under the following deposition conditions:
Plasma: $O_2$ Plasma (Reaction gas: $O_2$ 1000 sccm; Power: 192 W, 13.56 MHz); Deposition temperature: 190° C.; Deposition Pressure: 250 Pa; Film thickness: 24 nm.

Next, one of the substrates with the $TiO_2$ film was exposed to a $NF_3$ remote CCP plasma ($NF_3$ radicals) at a temperature of 100° C., and another of the substrate with the $TiO_2$ film was exposed to a $NF_3$ remote CCP plasma ($NF_3$ radicals) at a temperature of 200° C. The $NF_3$ remote plasma unit (PRU) was set at the following conditions (hereinafter referred to as "XP5"):
Power: 900 W
Frequency: 13.56 MHz
Pressure: 60 Pa
Flow rate: 2.8/200 sccm $NF_3$/Ar
Temperature: 200° C.

Figure 19:
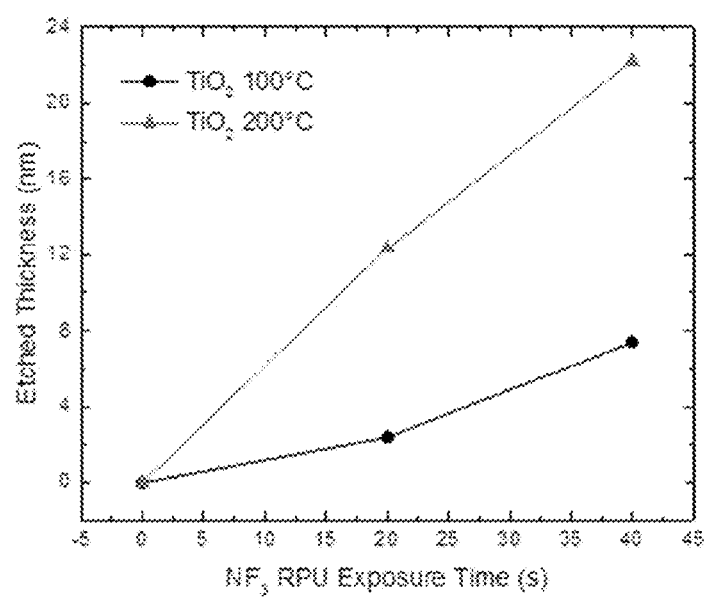
FIG. 19 is a graph, by way of example, showing etched thickness of different TiO films when being exposed to a remote plasma.

FIG. 19 is a graph showing the etched thickness of each $TiO_2$ film when being exposed to the remote plasma for a duration indicated in FIG. 19. As show in FIG. 19, it was confirmed that the dry etch rate was a function of plasma (radicals) exposure time and etching temperature.

Reference Example 2

A $TiO_2$ film was deposited (referred to as "TiO-1") on a substrate by PEALD under the deposition conditions which were the same as in Reference Example 1. Another $TiO_2$ film was deposited (referred to as "TiO-2") on a substrate by PEALD under the deposition conditions which were the same as in Reference Example 1 except that the feed time of the precursor during the ALD process was 0.05 s for TiO-1 and that was 0.4 s for TiO-2, and the film thickness of TiO-1 was 24 nm, and that of TiO-2 was 18 nm.

A $SiO_2$ film was deposited (referred to as "SiO-1") on a substrate by PEALD under the following deposition conditions:
Plasma: $O_2$ Plasma (Reaction gas: $O_2$; Power: 500 W, 13.56 MHz); Deposition temperature: 200° C.; Deposition pressure: 400 Pa; Film thickness: 30 nm.

Another $SiO_2$ film was deposited (referred to as "SiO-2") on a substrate by PEALD under the deposition conditions which were the same as those for SiO-1 except that the deposition temperature was 75° C., and the RF power was 50 W.

Next, the substrates with TiO-1, TiO-2, SiO-1, and SiO-2 were exposed to a $NF_3$ remote CCP plasma ($NF_3$ radicals) at a temperature of 200° C. for 40 s. The $NF_3$ PRU was set at condition XP5.

Figure 20:
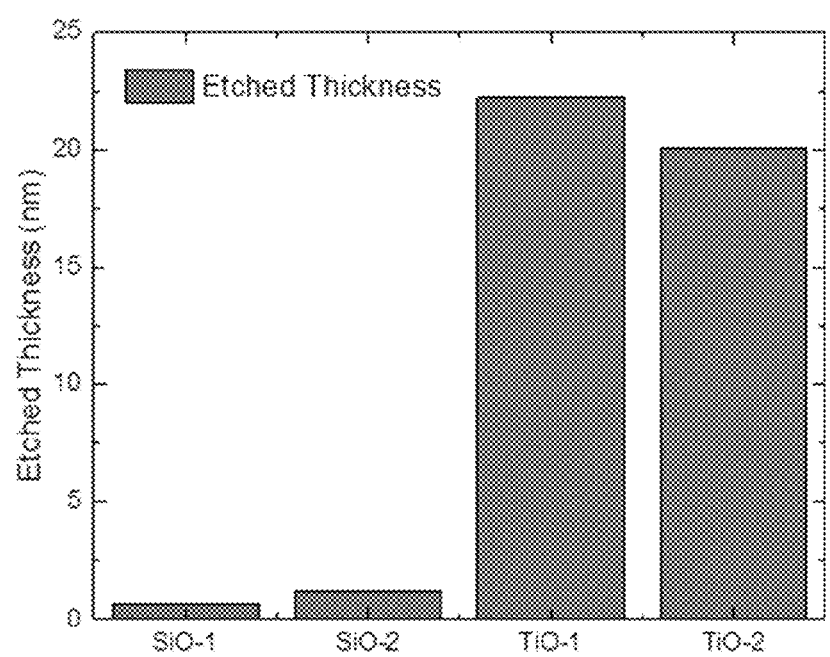
FIG. 20 is a graph showing, by way of example, etched thickness of different films.

FIG. 20 is a graph showing etched thickness of each TiO-1, TiO-2, SiO-1, and SiO-2. As show in FIG. 20, it was confirmed that etch selectivity varied depending on the material composition (SiO or TiO) and the quality (−1 or −2), indicating that the etch selectivity can be adjusted by changing the deposition conditions and/or selecting compositions, allowing for a wide range manipulation of etch selectivity.

Example 1

Figure 21A:
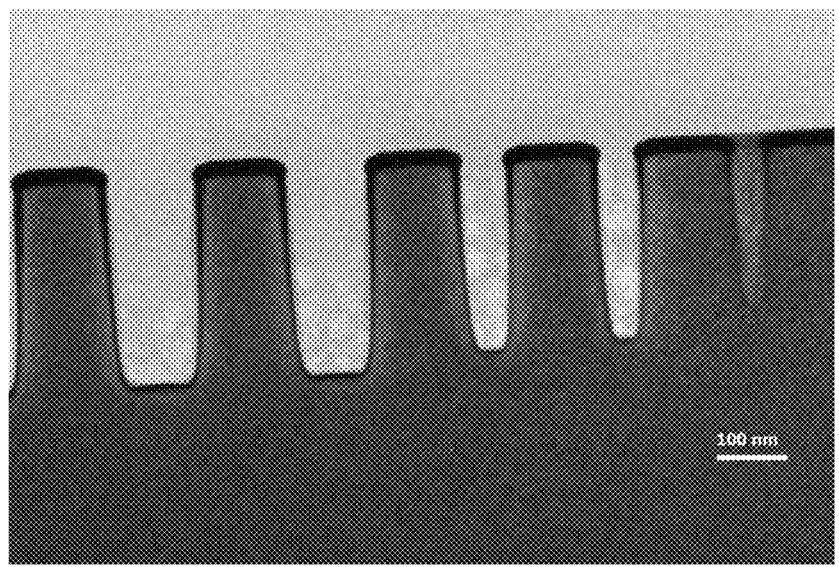
FIG. 21A shows, by way of example, a Scanning Electron Microscope (SEM) photograph of a cross-sectional view of titanium oxide film formed on a patterned structure before fluorine radical etching to form a layer structure having a top/bottom-remaining topology profile.

A TiO$_2$ film was deposited on a substrate having trenches by PEALD in the same manner as in Reference Example 1. This TiO$_2$ film corresponded to TiO-1 in Reference Example 2. FIG. 21A shows a Scanning Electron Microscope (SEM) photograph of a cross-sectional view of the titanium oxide film (TiO-1) formed on the patterned structure before fluorine radical etching to form a layer structure having a top/bottom-remaining topology profile. As shown in FIG. 21A, TiO-1 was deposited in manner of a top-predominant deposition scheme.

Figure 21B:
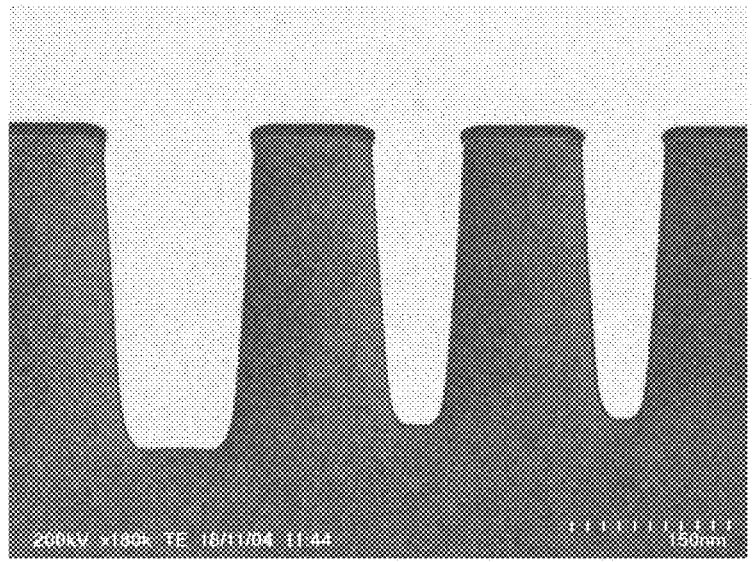
FIG. 21B shows, by way of example, a Scanning Electron Microscope (SEM) photograph of a cross-sectional view of titanium oxide film formed on a patterned structure after fluorine radical etching to form a layer structure having a top/bottom-remaining topology profile. The term "top/bottom" refers to "top and/or bottom" wherein the topology profile associated with the top and bottom portion varies depending on the aspect ratio of a trench; for example, when the aspect ratio is high (such as 5 or higher), the resultant layer structure may have a top-only-remaining topology profile.

Next, the substrates with the TiO-1 film was exposed to a NF$_3$ remote CCP plasma (NF$_3$ radicals) at a temperature of 200° C. The NF$_3$ remote plasma unit (PRU) was set at the XP5 conditions. FIG. 21B shows a Scanning Electron Microscope (SEM) photograph of a cross-sectional view of the titanium oxide film (TiO-1) formed on the patterned structure after fluorine radical etching to form a layer structure having a top-remaining topology profile. As shown in FIG. 21B, the NF$_3$ radical etching was conformal etching but was selective in its etching effects where TiO$_2$ was etched whereas the underlying Si was not etched (which can be further protected by an interlayer oxide by adding oxygen to a process gas). Since the NF$_3$ radical etching was conformal etching, the top-predominant deposition scheme strongly influenced the topology profile of the final layer structure, which was a top-remaining topology profile, wherein all portions of the deposited TiO-1 film in the trenches and on the top surface were substantially evenly or uniformly etched, resulting in substantially no film remaining on the sidewalls and at the bottoms of the trenches whereas the portions of the film on the top surfaces remained even although the thickness of the portions on the top surfaces reduced to a certain same degree. This example conforms that a top-remaining topology profile of a final layer structure can be achieved by depositing a film according to a top-predominant deposition scheme in combination with radical etching of the film according to a conformal etching scheme.

Example 2

Figure 22A:
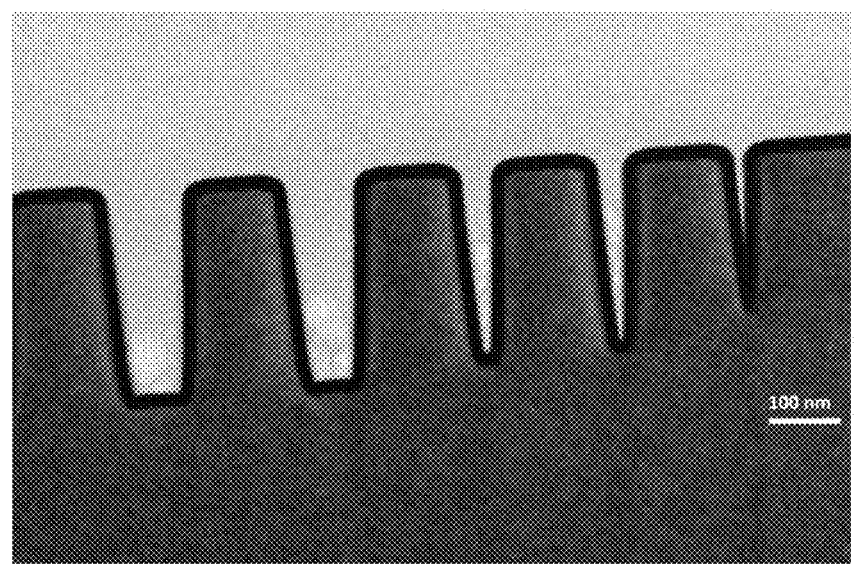
FIG. 22A shows, by way of example, a Scanning Electron Microscope (SEM) photograph of a cross-sectional view of silicon oxide film formed on a patterned structure before fluorine radical etching to form a layer structure having a conformal topology profile.

A TiO$_2$ film was deposited on a substrate having trenches by PEALD in the same manner as in Reference Example 2. This TiO$_2$ film corresponded to TiO-2 in Reference Example 2. FIG. 22A shows a Scanning Electron Microscope (SEM) photograph of a cross-sectional view of the titanium oxide film (TiO-2) formed on the patterned structure before fluorine radical etching to form a layer structure having a conformal topology profile. As shown in FIG. 22A, TiO-2 was deposited in manner of a conformal deposition scheme.

Figure 22B:
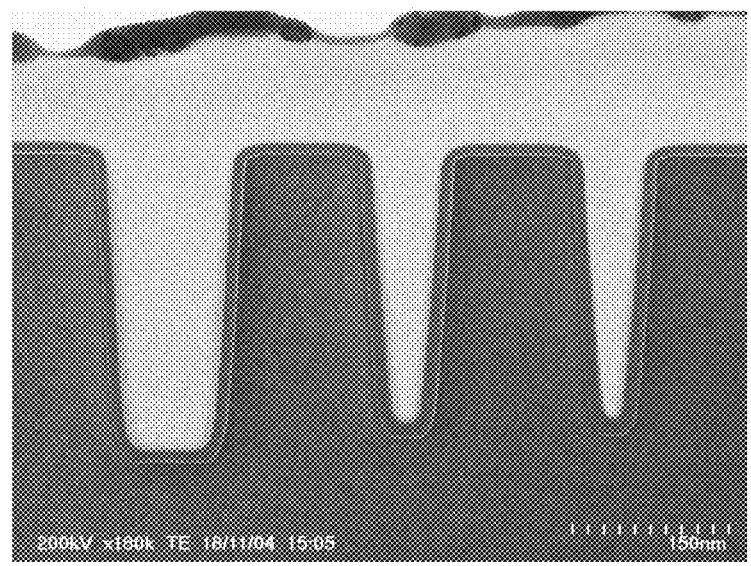
FIG. 22B shows, by way of example, a Scanning Electron Microscope (SEM) photograph of a cross-sectional view of titanium oxide film formed on a patterned structure after fluorine radical etching to form a layer structure having a conformal topology profile.

Next, the substrates with the TiO-2 film was exposed to a NF$_3$ remote CCP plasma (NF$_3$ radicals) at a temperature of 200° C. The NF$_3$ remote plasma unit (PRU) was set at the XP5 conditions. FIG. 22B shows a Scanning Electron Microscope (SEM) photograph of a cross-sectional view of the titanium oxide film (TiO-2) formed on the patterned structure after fluorine radical etching to form a layer structure having a conformal topology profile. As shown in FIG. 22B, the NF$_3$ radical etching was conformal etching but was selective in its etching effects where TiO$_2$ was etched whereas the underlying Si was not etched (which can be further protected by an interlayer oxide by adding oxygen to a process gas). Since the NF$_3$ radical etching was conformal etching, the conformal deposition scheme strongly influenced the topology profile of the final layer structure, which was a conformal topology profile, wherein all portions of the deposited TiO-2 film in the trenches and on the top surface were substantially evenly or uniformly etched, resulting in a final layer structure having a conformal topology profile even although the thickness of all the portions on the film reduced to a certain same degree. This example conforms that a conformal topology profile of a final layer structure can be achieved by depositing a film according to a conformal/uniform quality deposition scheme in combination with radical etching of the film according to a conformal etching scheme.

TiO-1 and TiO-2 had a similar etch rate for the used etching conditions as shown in FIG. 20, but the deposition profiles were made different as shown in FIG. 21A (top-predominant deposition) and FIG. 22A (conformal deposition), by changing at least one of the deposition process parameters (here, the feed time of the precursor). For forming other deposition profiles where conditions and/or structures are not specified herein, a skilled artisan in the art can readily provide such conditions and/or structures, in view of the present disclosure, as a matter of routine experimentation, without undue burden. In combination with conformal etching (radical etching), different deposition profiles result in different topology profiles as observed in FIGS. 21B and 22B.

Reference Example 3

Various SiN films (SiN-1 to SiN-7) and a SiO film were deposited on substrates, respectively, under the following deposition conditions:

SiN-1 (PEALD): Deposition temperature 450° C.; Deposition pressure: 3,000 Pa; Plasma: N$_2$ plasma (Reaction gas: N$_2$; Power: 880 W, 13.56 MHz; Plasma Duration: 3.3 s); Film thickness: 35 nm.

SiN-2 (PEALD): Deposition temperature 450° C.; Deposition pressure: 350 Pa; Plasma: N$_2$ plasma (Reaction gas: N$_2$; Power: 880 W, 13.56 MHz; Plasma Duration: 3.3 s); Film thickness: 50 nm.

SiN-3 (PEALD): Deposition temperature 100° C.; Deposition pressure: 350 Pa; Plasma: N$_2$ plasma (Reaction gas: N$_2$; Power: 115 W, 13.56 MHz; Plasma Duration: 3.3 s); Film thickness: 30 nm.

SiN-4 (PEALD): Deposition temperature 450° C.; Deposition pressure: 4 Torr; Plasma: NH$_3$ plasma (Reaction gas: NH$_3$; Power: 100 W, 13.56 MHz); Film thickness: 45 nm.

SiN-5 (PEALD): Deposition temperature 450° C.; Deposition pressure: 3 Torr; Plasma: NH$_3$ plasma (Reaction gas: NH$_3$; Power: 125 W); Film thickness: 50 nm.

SiN-6 (PRU): Same as those for SiN-1 except that remote CCP plasma was used.

SiN-7 (LPCVD-SiN; standard or reference SiN film).

SiO (PEALD): Same as those for SiO-1 (Reference Example 2); Film thickness: 40 nm.

SiN-1, SiN-2, SiN-3, and SiN-6 used a same first precursor, and SiN-4 and SiN-5 used a same second precursor which was different from the first precursor. The thickness of the deposited SiN films ranged between 25 nm and 55 nm, which were deposited on silicon substrates, respectively, by PEALD or other processes with different precursors and plasma conditions. The standard sample of SiN film (SiN-7) was deposited with NH$_3$ and SiH$_2$Cl$_2$ by low-pressure CVD. The density of the SiN-7 film was 3.18 g/cm$^3$. The essence here was that each film had a different density and/or a different hydrogen content, etc., and these differences determined its etch rate and/or RI (refractive index). The RI of the film can thus be used to estimate the etch rate (as discussed in relation to FIGS. 4A and 4B). For depositing these films where conditions and/or structures are not specified herein, a skilled artisan in the art can readily provide such conditions and/or structures, in view of the present disclosure, as a matter of routine experimentation, without undue burden.

Next, each substrate with the above SiN film was exposed to a $NF_3$ remote CCP plasma ($NF_3$ radicals) under condition XP5 except that the chamber temperature was 25° C. The substrate with the SiO film was exposed to $SF_6$ radicals, in place of $NF_3$ radicals. It should be noted that it was confirmed in a separate experiment that not only $SF_6$ radicals but also $NF_3$ radicals worked for SiO film.

FIG. 1 is a graph showing etched thickness of the above different films in relation to $NF_3$ remote plasma exposure time. In FIG. 1, the etched thickness of various SiN films with different film densities and/or different compositions, and that of the SiO film is plotted as a function of the $NF_3$ remote plasma exposure time. As shown in FIG. 1, it was confirmed that the dry etch rate was a function of plasma (radicals) exposure time and the film quality, and by adjusting the film quality, the dry etch rate of the film can be adjusted, so as to set proper etch selectivity of one film relative to another film for forming a target layer structure.

Figure 13:
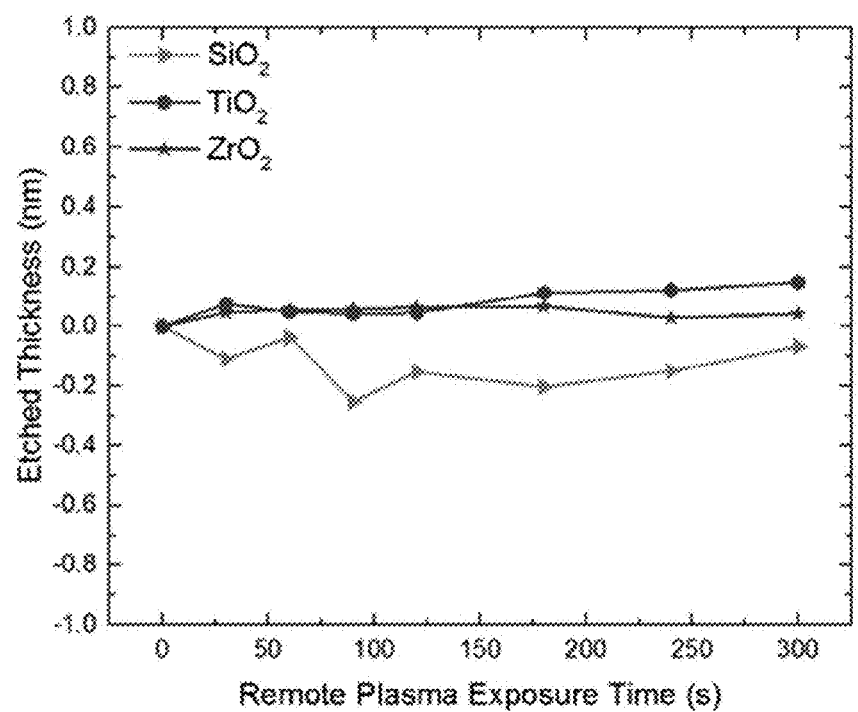
FIG. 13 is a graph showing, by way of example, etched thickness of different oxide films when being exposed to a remote plasma.

It should be noted that films constituted by $TiO_2$, $ZrO_2$, or the like were deposited by PEALD in a manner similar to $SiO_2$, and showed etch selectivity similar to that of $SiO_2$. FIG. 13 is a graph showing etched thickness of different oxide films when being exposed to a remote plasma.

Comparative Example 1

The films of SiN-1 to SiN-6 and SiO were formed on substrates, respectively, in the same manner as in Reference Example 3, and then, instead of radical dry etching used in Reference Example 3, the films were subjected to wet etching (dHF 100:1).

Figure 2:
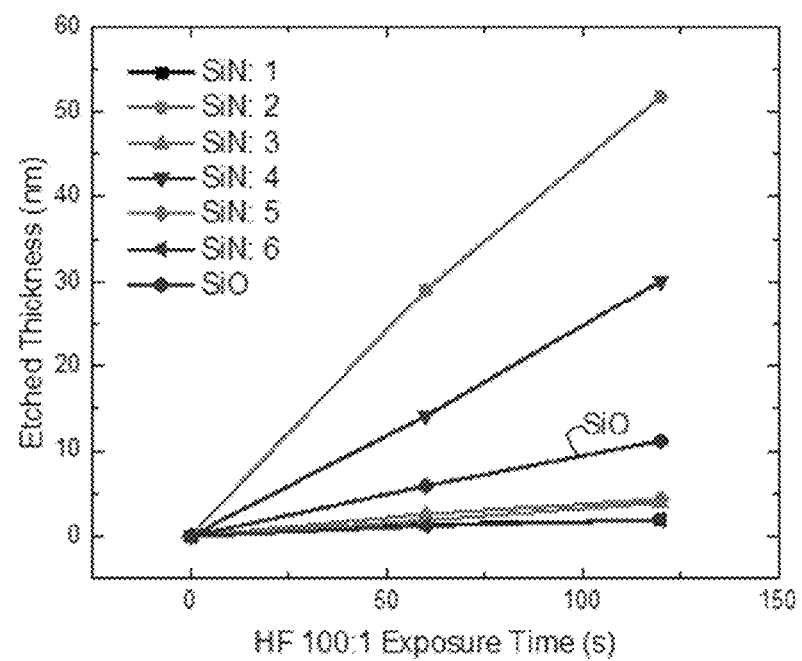
FIG. 2 is a graph showing, by way of example, etched thickness of different SiN films in relation to HF wet etch exposure time.

FIG. 2 is a graph showing etched thickness of the different SiN films and the SiO film in relation to HF wet etch exposure time. As can be seen, the SiN etch rates for the $NF_3$ remote plasma were very comparable to the wet etch rates. Additionally, the $NF_3$ remote plasma etch was selective so that $SiO_2$ was not etched as shown in FIG. 1, whereas HF etched $SiO_2$ as shown in FIG. 2.

Reference Example 4

Figure 3:
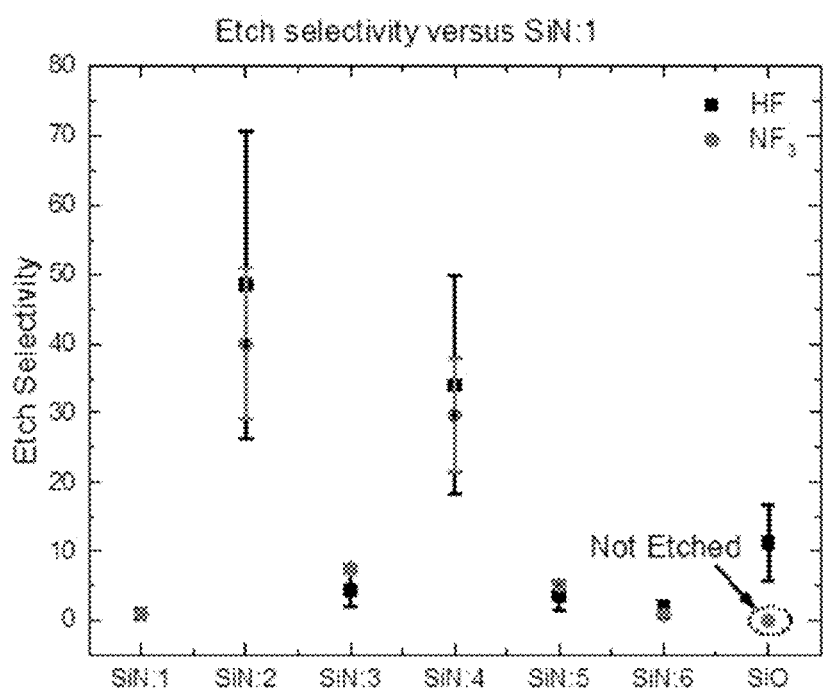
FIG. 3 is a graph showing, by way of example, etch selectivity of different SiN films in $NF_3$ remote plasma etching as compared with (with reference to) the etched thickness of film SiN:1.

FIG. 3 is a graph re-plotting the etch selectivity of the above-discussed different SiN films in the $NF_3$ remote plasma etching as compared with (with reference to) the etched thickness of film SiN-1, based on FIGS. 1 and 2. The etch selectivity of one SiN film relative to a reference SiN film is defined as a ratio of etch rate (or etched thickness) of the one SiN film to etch rate (or etched thickness) of the reference SiN film under reference dry etching conditions. Here, the SiN-1 film was selected as a reference SiN film. As shown in FIG. 3, the etch selectivity of a SiN film relative to the SiN-1 film can be tuned by adjusting its deposition conditions in a manner varying the deposition conditions for SiN-2 to SiN-6 (resulting in compositional difference, structural difference, physical difference, chemical difference, and the like between the SiN film and the SiN-1 film). As shown in FIG. 3, the etch selectivity of a SiN film can be tuned in a range of from 1 to 50 by $NF_3$ radical etching. The $SiO_2$ film was substantially not etched by $NF_3$ radical etching (within the limits of error), and thus, when using the $SiO_2$ film as a reference film, the etch selectivity of a SiN film was at least 5 for SiN-1 and 100 for SiN-2 (i.e. SiN-2 was etched at least 100 times faster than $SiO_2$).

By using $SF_6$, in place of $NF_3$, generated in a remote microwave plasma (2.45 GHz, 50 W, 2 Pa), the difference in etch rate between the SiN films can further be increased to a maximum of 100. The etch selectivity of a SiN film relative to $SiO_2$ or other oxide was at least 25 for SiN-1 and at least 4000 for SiN-2 (after taking the measurement error into account). It should be noted that the longer the experiment duration, the lower the measurement error becomes, meaning that the etch selectivity is likely to be close to perfect (infinite).

Reference Example 5

Figure 4A:
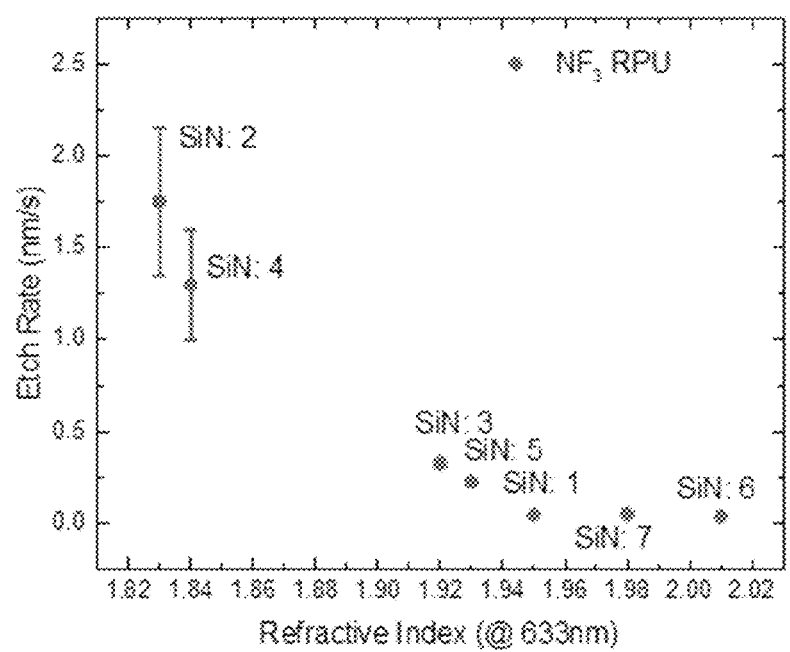
FIG. 4A is a graph showing, by way of example, etch rates of different SiN films by $NF_3$ remote plasma etching as compared with (with reference to) the etch rate of film SiN:1 in relation to refractive indexes of the different films.

The SiN films constituted by SiN-1 to SiN-7, respectively, described in Reference Example 3 were subjected to further analysis, wherein their refractive indexes were measured. FIG. 4A is a graph showing etch rates of the different SiN films by $NF_3$ remote plasma etching as compared with (with reference to) the etch rate of film SiN-1 in relation to refractive indexes of the different films. As shown in FIG. 4A, the refractive index of the SiN films and the dry etch rate thereof by radicals have a strong correlation (particularly, in a refractive index range of about 1.95 or lower, when the refractive index decreases, the etch rate increases linearly for the $NF_3$ remote plasma), and since the dry etch properties of a film are attributed to and associated with film composition and density, etc., it is understood that the refractive index can be used as an indirect measurement for evaluating their compositions and densities, etc. For example, a film having a lower density and/or lower quality (inferior composition) than those of another film results in a lower refractive index than that of the another film. Accordingly, although the density of the SiN-6 film only is known to be 3.18 $g/cm^3$, the other SiN films which have refractive indexes lower than that of the SiN-6 film can reasonably be determined to have lower density and/or lower quality (inferior composition) than those of the SiN-6 film.

Figure 4B:
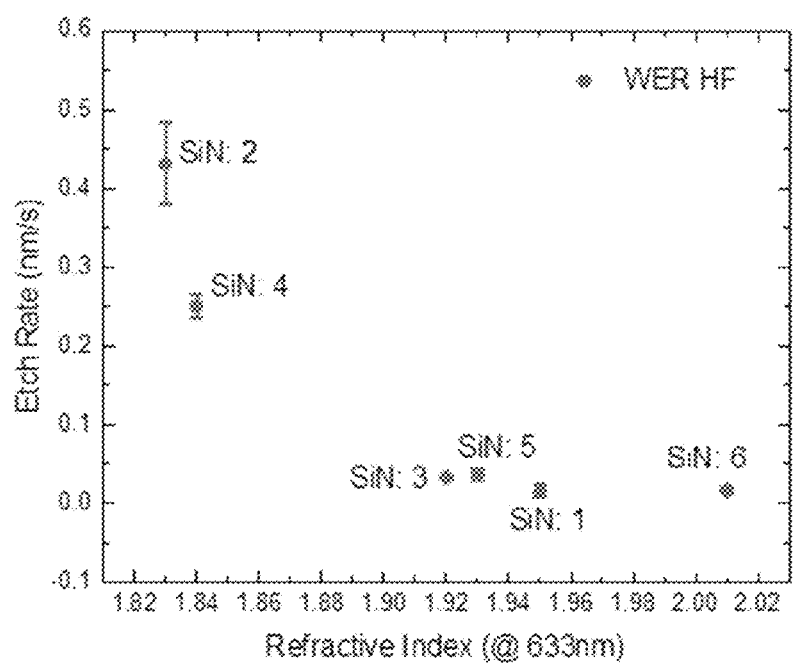
FIG. 4B is a graph showing, by way of example, etch rates of different SiN films by HF wet etching as compared with (with reference to) the etch rate of film SiN:1 in relation to refractive indexes of the different films.

FIG. 4B is a graph showing etch rates of the different SiN films (SiN-1 to SiN-6 as described in Comparative Example 1) by HF wet etching as compared to (with reference to) the etch rate of film SiN-1 in relation to refractive indexes of the different films. As can be seen from FIG. 4B, for HF wet etching, the dependency of etch rate on the refractive index was not as straightforward or linear as that for $NF_3$ remote plasma etching, and more variations between the samples were observed.

Reference Example 6

Figure 5:
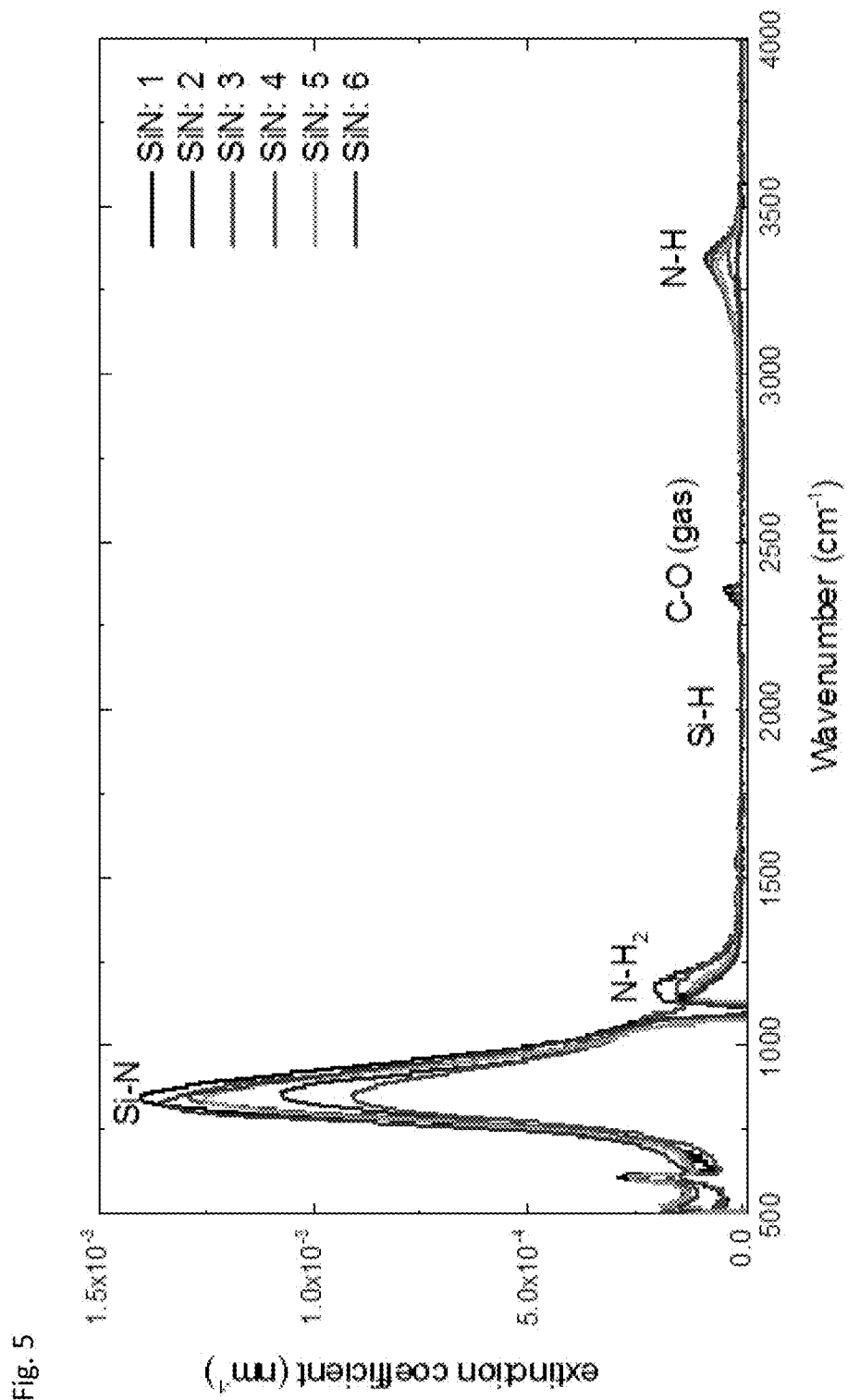
FIG. 5 shows, by way of example, a Fourier Transform Infrared (FTIR) spectrum (in color) of different SiN films.

The SiN films constituted by SiN-1 to SiN-6, respectively, described in Reference Example 3 were subjected to further analysis, wherein their compositions/densities were analyzed. FIG. 5 is a Fourier Transform Infrared (FTIR) spectrum (in color) of the different SiN films of different compositions and densities, wherein the extinction coefficient (absorbance normalized to the thickness of the films) is plotted versus the wavenumber. The absorption peaks related to the presence of Si—N, N—H, Si—H, $CO_2$ bonds in each film are indicated in FIG. 5. The different area sizes of the Si—N peak indicate the differences in density between the films, whereas the presence of N—H bonds, etc. indicates the differences in their compositions. It should be noted that not all bonds can be measured by FTIR, meaning that it does not provide a complete picture of compositional differences.

Figure 6:
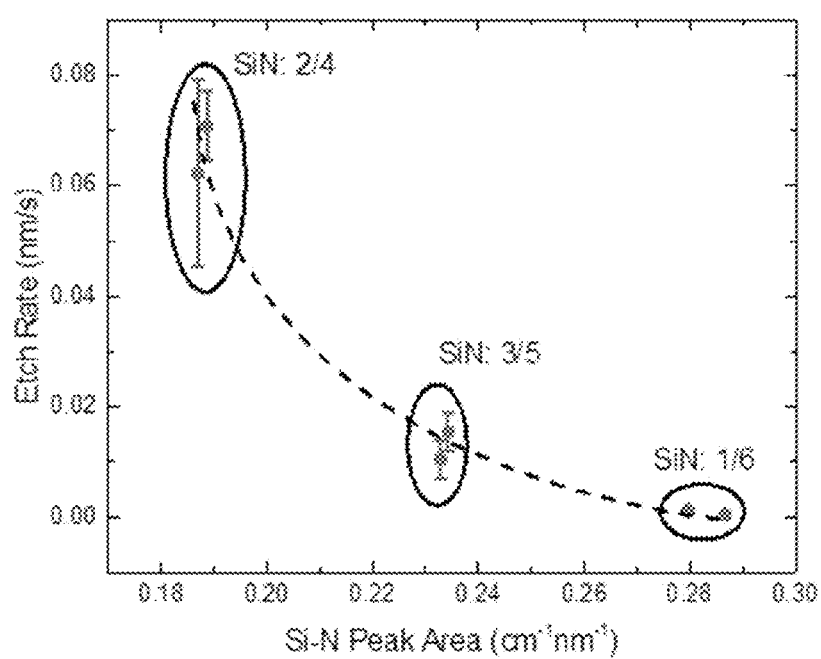
FIG. 6 is a graph showing, by way of example, the relationship between etch rates of SiN films and their Si—N peak area sizes.

FIG. 6 is a graph showing the relationship between etch rates of the SiN films and their Si—N peak area sizes indicated in FIG. 5. The data show that the lower the amount of Si—N bonding (lower density) of the SiN film, the higher the etch rate becomes. Thus, by changing the amount of Si—N bonding in a SiN film (by varying deposition process parameters), the etch rate of the SiN film can be tuned. A skilled artisan in the art can tune the etch rate by adjusting deposition conditions in view of the present disclosure, especially with the guidance disclosed herein, as a matter of routine experimentation, without undue burden.

Example 3

A SiN-4 film was deposited on a substrate having trenches (250 nm in depth, 150 nm in opening width) by PEALD in the same manner as in Reference Example 3. The thickness of the SiN-4 film on the top surface of the substrate was 26 nm. Also, a SiN-3 film was deposited on a substrate having trenches (250 nm in depth, 150 nm in opening width) by PEALD in the same manner as in Reference Example 3. The thickness of the SiN-3 film on the top surface of the substrate was 29 nm. A target topology profile of a final layer structure using the SiN-4 film was a side-remaining topology profile, whereas that using the SiN-3 film was a top/bottom-remaining topology profile.

The deposition conditions for the SiN-4 film had been turned to perform top/bottom low-quality (low density) deposition by manipulating the process parameters as discussed in this disclosure, as follows:

(i) providing reference deposition conditions and reference dry-etching conditions (here condition XP5 for conformal etching) under which a SiN film having a reference topology profile was formed on a surface having trenches of a substrate by conducting a PEALD deposition process under the reference deposition conditions and a radical etching process under condition XP5;

(ii) upon comparing the thus-obtained reference topology profile with the target topology profile, changing at least one parameter of the reference deposition conditions in a manner forming a layer structure having a topology profile on the substrate closer to the target topology profile than the reference topology profile (e.g., increasing RF power and/or decreasing process pressure, and/or changing the precursor and/or the reaction gas), and conducting a PEALD deposition process and a radical etching process under the changed deposition conditions (the dry-etching conditions, condition XP5, were unchanged); and (iii) repeating process (ii) until the thus-obtained topology profile is substantially close or equivalent to the target topology profile.

Similarly, the deposition conditions for the SiN-3 film had been turned to perform side low-quality (low density) deposition by manipulating the process parameters as discussed in this disclosure.

Next, the substrates with the SiN-4 film and the SiN-3 film were exposed to a $NF_3$ remote CCP plasma ($NF_3$ radicals) at a temperature of 25° C., respectively. The $NF_3$ remote plasma unit (PRU) was set at the XP5 conditions.

Figure 12A:
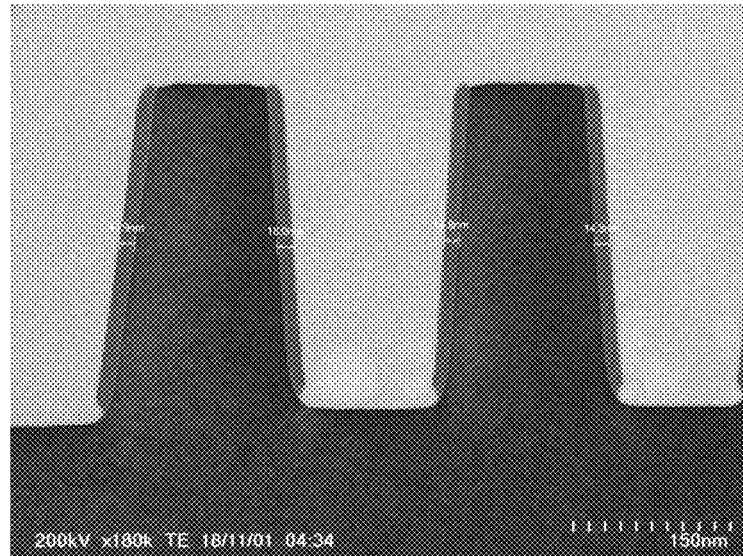
FIG. 12A shows, by way of example, a Scanning Electron Microscope (SEM) photograph of a cross-sectional view of silicon nitride film formed on a patterned structure after fluorine radical etching according to a top/bottom removal scheme.
Figure 12B:
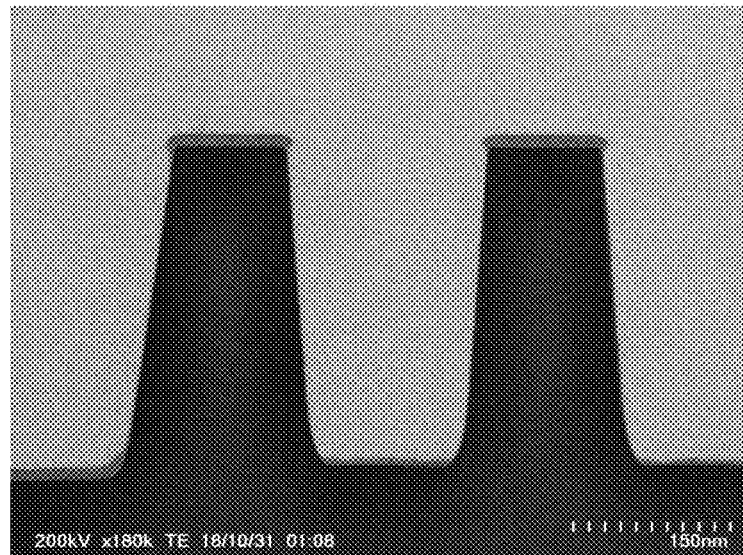
FIG. 12B shows, by way of example, a Scanning Electron Microscope (SEM) photograph of a cross-sectional view of silicon nitride film formed on a patterned structure after fluorine radical etching according to a side removal scheme.

FIG. 12A shows a Scanning Electron Microscope (SEM) photograph of a cross-sectional view of the SiN-4 film formed on the patterned structure after fluorine radical etching according to a top/bottom removal scheme. FIG. 12B shows a Scanning Electron Microscope (SEM) photograph of a cross-sectional view of the SiN-3 film formed on the patterned structure after fluorine radical etching according to a side removal scheme. These confirm that the topology profile of the final layer structure after dry etching can be adjusted by adjusting the deposition conditions and/or the quality (e.g., density) difference between a side portion and a top portion of the deposited film.

Examples 4 to 6

SiN films A, B, and C were deposited on substrates having trenches, respectively, by PEALD under deposition conditions shown in FIG. 18B. The film thickness of each SiN film was shown in FIG. 18A. FIG. 18A also shows Scanning Transmission Electron Microscope (STEM) photographs of cross-sectional views of the SiN films ("AsDepo"). As shown in FIG. 18A, SiN film A was conformal (with a conformality of 89%), whereas SiN films B and C were top-predominant (with conformalities of 67% and 60%, respectively). Also, SiN film A and SiN films B and C were deposited according to a side-low quality scheme and a top/bottom-low quality scheme, respectively, so that after being exposed to conformal (isotropic) dry-etching, SiN film A would have a top-remaining topology profile, whereas SiN films B and C would have a side-remaining topology profile. The difference between SiN films B and C was the opening width of the trench on which the films were deposited, wherein although the deposition conditions for SiN films B and C were the same, the conformality of the films were different due to the loading effect.

Next, SiN films A, B, and C were exposed to a $NF_3$ remote CCP plasma ($NF_3$ radicals) under the dry-etching conditions shown in FIG. 18B. The resultant layer structures are shown in FIG. 18A ("After Dry Etch"). As shown in FIG. 18A, by exposing SiN films A, B, and C to the conformal (isotropic) dry etching, their conformalities were changed from 89% to 44% ("conformal" to "top-remaining"), 67% to 132% ("top-predominant" to "side-remaining"), and 60% to 132% ("top-predominant" to "side-remaining"), respectively, due to the differences in film quality (density or etch rate) between a side portion of the film deposited on the sidewalls and a lateral portion of the film deposited on the top/bottom of the trenches ("side-low quality" in film A, "top/bottom-low quality" in films B and C), resulting in the differences in etch selectivity (or etching rate selectivity) between the side portion and the lateral portion of each film. These confirm that the topology profile of the final layer structure after dry etching can be adjusted by adjusting the deposition conditions and/or the quality (e.g., density) difference between a side portion and a lateral portion of the deposited film.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A method for fabricating a layer structure having a target topology profile, the method comprising:
    (a) providing a substrate with a lateral surface and a side surface;
    (b) depositing a dielectric layer under adjusted deposition conditions onto the lateral surface and the side surface, wherein the dielectric layer comprises a lateral portion disposed on the lateral surface and a side portion disposed on the side surface, and wherein the lateral portion has a different etch resistance than the side portion, wherein the adjusted deposition conditions comprise adjusted conditions of at least one of plasma power, gas selection, gas flow rate, pressure, and temperature in a reaction space;

(c) exposing the lateral portion and the side portion to fluorine and/or chlorine radicals, thereby removing at least a part of the dielectric layer, wherein a greater portion of the side portion or the lateral portion is removed than the other of the side portion or lateral portion, thereby forming a layer structure having the target topology profile on the substrate, wherein the target topology profile is either a side face-remaining topology profile or alternatively a lateral face-remaining topology profile.

2. The method of claim 1, wherein the side portion has a higher etch resistance than the lateral portion, wherein a greater portion of the lateral portion is removed than the side portion, and the target topology profile is a side face-remaining topology profile.

3. The method of claim 1, wherein the side portion has a lower etch resistance than the lateral portion, wherein a greater portion of the side portion is removed than the lateral portion, and the target topology profile is a lateral face-remaining topology profile.

4. The method of claim 1, wherein an etch selectivity of the side portion to the lateral portion is 1.5 or greater, wherein the etch selectivity of the side portion to the lateral portion is defined as a ratio of etch rate of the side portion to etch rate of the lateral portion under a first dry-etching conditions.

5. The method of claim 1, wherein an etch selectivity of the lateral portion to the side portion is 1.5 or greater, wherein the etch selectivity of the lateral portion to the side portion is defined as a ratio of etch rate of the lateral portion to etch rate of the side portion under a first dry-etching conditions.

6. The method according to claim 4, wherein an etch selectivity of the side portion to the lateral portion is 5 or greater.

7. The method according to claim 1, wherein an etch selectivity of the lateral portion to the side portion is 5 or greater.

8. The method according to claim 1, wherein step (b) and step (c) are conducted in a same chamber.

9. The method according to claim 8, wherein step (b) comprises exposing the lateral portion and the side portion to fluorine radicals, wherein the fluorine radicals are generated remotely or within the same chamber from a gas comprising fluorine, nitrogen, and a noble gas.

10. The method according to claim 1, wherein the side portion and the lateral portion comprise different materials.

11. The method according to claim 10, wherein one of the side portion and the lateral portion comprise SiO and the other of the side portion and the lateral portion comprise a metal-compound material.

12. The method according to claim 10, wherein primary chemical bonds constituting the side portion and the lateral portion are the same.

13. The method according to claim 1, wherein the side portion and the lateral portion comprise SiN or SiO.

14. The method according to claim 1, wherein one of the side portion and the lateral portion comprise SiN and the other of the side portion and the lateral portion comprise an oxide.

15. The method according to claim 1, wherein the side portion and the lateral portion are deposited having different densities.

16. The method according to claim 1, wherein the side portion and the lateral portion are deposited having different thicknesses.

* * * * *